United States Patent
Yamazawa

(10) Patent No.: US 9,293,299 B2
(45) Date of Patent: *Mar. 22, 2016

(54) PLASMA PROCESSING APPARATUS

(75) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 753 days.

This patent is subject to a terminal disclaimer.

(21) Appl. No.: 13/434,922

(22) Filed: Mar. 30, 2012

(65) Prior Publication Data

US 2012/0247679 A1 Oct. 4, 2012

Related U.S. Application Data

(60) Provisional application No. 61/472,654, filed on Apr. 7, 2011.

(30) Foreign Application Priority Data

Mar. 30, 2011 (JP) ................................. 2011-074875

(51) Int. Cl.
*H01L 21/306* (2006.01)
*C23C 16/00* (2006.01)
*H01J 37/32* (2006.01)

(52) U.S. Cl.
CPC ............ *H01J 37/321* (2013.01); *H01J 37/3211* (2013.01)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ....... 118/723 I, 723 IR, 723 AN; 156/345.48, 156/345.49; 315/111.51
See application file for complete search history.

(56) References Cited

U.S. PATENT DOCUMENTS

| 6,164,241 A | 12/2000 | Chen et al. |
| 2002/0189763 A1 | 12/2002 | Kwon et al. |
| 2004/0040939 A1* | 3/2004 | Oh .......................... 219/121.36 |
| 2005/0128160 A1* | 6/2005 | Howald et al. ............... 343/866 |
| 2010/0175832 A1* | 7/2010 | Nishio ..................... 156/345.49 |

FOREIGN PATENT DOCUMENTS

| CN | 1392754 A | 1/2003 |
| CN | 1689132 A | 10/2005 |

(Continued)

*Primary Examiner* — Luz Alejandro Mulero
(74) *Attorney, Agent, or Firm* — Pearne & Gordon LLP

(57) ABSTRACT

In an inductively coupled plasma processing apparatus, it is possible to control a plasma density distribution while suppressing a wavelength effect within a RF antenna. Provided at a ceiling of a chamber 10 or above a dielectric window 52 is a circular ring-shaped RF antenna 54 for generating inductively coupled plasma within the chamber 10. This RF antenna 54 includes two coil segments 84(1) and 84(2) each having a semicircular arc shape. The coil segments 84(1) and 84(2) are electrically connected to each other in parallel with respect to a high frequency power supply unit 62. On the dielectric window 52, a circular ring-shaped floating coil 60 having a variable capacitor 58 coupled to the RF antenna 54 by an electromagnetic induction is provided. The variable capacitor 58 is varied in a certain range by a capacitance varying unit 82 under the control of a main controller 80.

27 Claims, 32 Drawing Sheets

(56) References Cited

FOREIGN PATENT DOCUMENTS

| | | |
|---|---|---|
| JP | 10-064697 A | 3/1998 |
| JP | 2002-151481 A | 5/2002 |
| JP | 2003-234338 A | 8/2003 |
| JP | 2005-534150 A | 11/2005 |
| JP | 2009-515292 A | 4/2009 |
| JP | 2010-135298 A | 6/2010 |
| WO | 2004/010457 A1 | 1/2004 |
| WO | 2007/044248 A2 | 4/2007 |
| WO | 2010/144555 A2 | 12/2010 |

* cited by examiner

CURRENT DENSITY DISTRIBUTION IN DONUT-SHAPED PLASMA

CURRENT DENSITY DISTRIBUTION IN DONUT-SHAPED PLASMA

PLANE VIEW

FRONT VIEW

COIL CONDUCTOR CROSS SECTION CONFIGURATION (a) S₁:OFF, S₂:OFF, OPEN STATE (b) S₁:ON, S₂:OFF, SMALL CAPACITY (c) S₁:ON, S₂:OFF, MAXIMUM CAPACITY (d) S₁:ON, S₂:OFF, SHORT CIRCUIT STATE

PLASMA PROCESSING APPARATUS

CROSS-REFERENCE TO RELATED APPLICATION

This application claims the benefit of Japanese Patent Application No. 2011-074875 filed on Mar. 30, 2011, and U.S. Provisional Application Ser. No. 61/472,654 filed on Apr. 7, 2011, the entire disclosures of which are incorporated herein by reference.

FIELD OF THE INVENTION

The present disclosure relates to a technique for performing a plasma process on a processing target substrate; and, more particularly, to an inductively coupled plasma processing apparatus.

BACKGROUND OF THE INVENTION

In a manufacturing process of a semiconductor device or a FPD (Flat Panel Display), plasma is used to perform a process, such as etching, deposition, oxidation or sputtering, so as to perform a good reaction of a processing gas at a relatively low temperature. Conventionally, plasma generated by a high frequency electric discharge in MHz frequency band has been used in this kind of plasma process. The plasma generated by the high frequency electric discharge is largely divided into capacitively coupled plasma and inductively coupled plasma according to a plasma generation method (in view of an apparatus).

Generally, in an inductively coupled plasma processing apparatus, at least a part (for example, a ceiling) of walls of a processing chamber may have a dielectric window, and a high frequency power is supplied to a coil-shaped RF antenna positioned at an outside of this dielectric window. The processing chamber serves as a depressurizable vacuum chamber, and a target substrate (for example, a semiconductor wafer and a glass substrate) is provided at a central region within the chamber. A processing gas is supplied into a processing space formed between the dielectric window and the substrate. A high frequency AC magnetic field having magnetic force lines is generated around the RF antenna by a high frequency current flowing in the RF antenna. The magnetic force lines of the high frequency AC magnetic field are transmitted to the processing space within the chamber via the dielectric window. As the RF magnetic field of the high frequency AC magnetic field changes with time, an inductive electric field is generated in an azimuth direction within the processing space. Then, electrons accelerated by, this inductive electromagnetic field in the azimuth direction collide with molecules or atoms of the processing gas so as to be ionized. In this process, donut-shaped plasma may be generated.

Since a large processing space is formed within the chamber, the donut-shaped plasma can be diffused efficiently in all directions (particularly, in a radial direction) and a plasma density on the substrate becomes very uniform. However, only with a conventional RF antenna, the plasma density on the substrate is not sufficiently uniform for most plasma processes. In the inductively coupled plasma processing apparatus, it is also one of the important issues to improve uniformity of the plasma density on the substrate since a uniformity/reproducibility and a production yield of a plasma process depend on the uniformity of the plasma density.

Among them, there has been known a technique in which a single RF antenna is used and a passive antenna is provided near the RF antenna (Patent Document 1). This passive antenna is configured as an independent coil that is not supplied with a high frequency power from a high frequency power supply. With respect to a magnetic field of the RF antenna (inductive antenna), intensity of a magnetic field within a loop of the passive antenna is reduced, and intensity of an adjacent magnetic field outside the loop of the passive antenna is increased. Thus, a RF electromagnetic field distribution in a radial direction is changed within a plasma generation region in a chamber.

Further, there has been known a technique in which a RF antenna is divided into a multiple number of circular ring-shaped coils in a radial direction, and these circular ring-shaped coils are connected electrically in parallel to one another in order to increase uniformity of a plasma density distribution in the radial direction (for example, Patent Document 2).

Patent Document 1: Published Japanese Translation of PCT Patent Application No. 2005-534150
Patent Document 2: U.S. Pat. No. 6,164,241

In Patent Document 1, the magnetic field of the RF antenna (inductive antenna) is influenced by the passive antenna, and the RF electromagnetic field distribution in the radial direction is changed within the plasma generation region in the chamber. However, since an operation of the passive antenna is not sufficiently studied and verified, a specific apparatus configuration capable of accurately controlling the plasma density distribution as desired by using the passive antenna is not suggested.

In a recent plasma process, as a substrate becomes larger and a device becomes miniaturized, plasma of a high density and a large diameter is demanded. Therefore, a process on a substrate needs to be more uniformed than before. In this regard, an inductively coupled plasma processing apparatus is configured to generate donut-shaped plasma inside a dielectric window close to a RF antenna and diffuse the donut-shaped plasma in all directions toward the substrate. A diffusion state of the plasma varies depending on an internal pressure of a chamber, and a plasma density distribution on the substrate is easily changed. The plasma density distribution within the donut-shaped plasma may be changed depending on a high frequency power supplied to the RF antenna or a flow rate of a processing gas introduced into the chamber. Therefore, if a magnetic field of the RF antenna (inductive antenna) is not controlled so as to maintain uniformity of a plasma process on the substrate even when a processing condition of a process recipe is changed, it is not possible to satisfy diverse and high-degree of process performances required by a recent plasma processing apparatus.

In the above-described conventional RF antenna division method, a RF current supplied to the RF antenna from a high frequency power supply may flow in a greater amount through an inner coil having a smaller diameter (i.e., smaller impedance), whereas a relatively small amount of RF current may flow through an outer coil having a larger diameter (i.e., larger impedance) within the RF antenna. Accordingly, plasma density within the chamber may be high at a central portion of the chamber in a radial direction while the plasma density may be low at a peripheral portion thereof. Thus, in the second type method, capacitors for adjusting impedance are additionally coupled to the respective coils within the RF antenna so as to adjust a split ratio of the RF current flowing in the respective coils.

In such a case, if a capacitor for adjusting impedance is provided on a return line or an earth line of the high frequency power supply, i.e., on an end of the RF antenna, an electric potential of a coil may become higher than a ground potential, so that an effect (a sputtering effect) causing damage and degradation of the dielectric window by ion attack from the plasma can be suppressed. However, since the coil of the RF antenna is electrically terminated through the capacitor, a length of an equivalent short-circuit resonance line is shortened. As a result, standing wave of electric current having a node in the vicinity of a RF input terminal of the RF antenna may be easily formed (i.e. a wavelength effect may easily occur) in the outer coil having the larger diameter (length). If the wavelength effect occurs, it may be difficult to achieve uniformity of plasma density distribution in a radial direction as well as in a circumferential direction.

BRIEF SUMMARY OF THE INVENTION

In view of the foregoing, illustrative embodiments provide an inductively coupled plasma processing apparatus capable of accurately controlling a plasma density distribution as desired by using a coil in an electrically floating state while suppressing a wavelength effect within a RF antenna.

In accordance with one aspect of an illustrative embodiment, there is provided a plasma processing apparatus including a processing chamber having a dielectric window; a substrate holding unit configured to hold thereon a processing target substrate within the processing chamber; a processing gas supply unit configured to supply a processing gas into the processing chamber to perform a plasma process on the substrate; a RF antenna, provided outside the dielectric window to generate plasma of the processing gas within the processing chamber by inductive coupling, having a multiple number of coil segments that are arranged along a loop having a predetermined shape and a predetermined size while electrically connected to each other in parallel; a high frequency power supply unit configured to supply a high frequency power having a frequency for generating a high frequency electric discharge of the processing gas; at least one floating coil that is in an electrically floating state and provided outside the processing chamber to be coupled to the RF antenna by an electromagnetic induction; and a capacitor provided in a loop of the at least one floating coil.

In accordance with the plasma processing apparatus of the illustrative embodiment, when the high frequency power is supplied from the high frequency power supply unit to the RF antenna, a RF magnetic field is generated around a conductor of the RF antenna by a high frequency current flowing in the RF antenna, and an induced electric field is generated in the processing chamber by the high frequency electric discharge of the processing gas. Herein, since the RF antenna includes a multiple number of coil segments connected electrically in parallel to one another, a wavelength effect within the RF antenna and a voltage drop depend on a length of the coil segments. Therefore, the coil segment number or the coil segment length within each coil is set so as to prevent the wavelength effect from occurring within the individual coil segments and also so as to prevent the voltage drop from being increased. Regarding a magnetomotive force within the RF antenna, a self-inductance of coil segments of each coil is set to be substantially equal to one another, so that a regular or uniform high frequency current flows in the circumferential direction of the coil. Thus, it is possible to constantly obtain a uniform plasma density distribution in the circumferential direction.

Meanwhile, an induced electromotive force is generated within the floating coil by an electromagnetic induction between each coil segment of the RF antenna and the floating coil, and an induced current flows in the floating coil. An induced electric field is generated in a plasma generation space within the processing chamber by the induced current flowing in the floating coil, and the induced electric field is negatively or positively involved in the high frequency electric discharge of the processing gas or inductively coupled plasma generation.

An operation of the floating coil on a density distribution of plasma (donut-shaped plasma) generated in the processing chamber by an inductive coupling depends on a relatively positional relationship between the RF antenna and the floating coil and also a magnitude or a direction of the current flowing in the floating coil.

A magnitude and a phase (direction) of the electric current flowing in the floating coil depend on the induced electromotive force generated in a loop of the floating coil and impedance in the loop. In this plasma processing apparatus, the impedance, particularly a reactance, in the loop is adjusted, and the magnitude or the direction of the electric current in the loop is controlled by electrostatic capacitance of a capacitor provided in the loop of the floating coil.

By using the floating coil having the capacitor, it is possible to variously control the plasma density distribution in the donut-shaped plasma in the radial direction as desired. Accordingly, it is possible to accurately control the plasma density distribution around the substrate on the substrate holding unit as desired, and it is possible to increase uniformity of a plasma process.

In accordance with another aspect of an illustrative embodiment, there is provided a plasma processing apparatus including a processing chamber having a dielectric window; a substrate holding unit configured to hold thereon a processing target substrate within the processing chamber; a processing gas supply unit configured to supply a processing gas into the processing chamber to perform a plasma process on the substrate; a RF antenna, provided outside the dielectric window to generate plasma of the processing gas within the processing chamber by inductive coupling, having an inner antenna coil and an outer antenna coil respectively provided at an inner side and an outer side thereof in a radial direction with a gap therebetween; a high frequency power supply unit configured to supply a high frequency power having a frequency for generating a high frequency electric discharge of the processing gas; at least one floating coil that is in an electrically floating state and provided outside the processing chamber to be coupled to at least one of the inner antenna coil and the outer antenna coil by an electromagnetic induction; and a capacitor provided in a loop of the at least one floating coil. The inner antenna coil may include a single inner coil segment or more than one inner coil segments connected in series. The outer antenna coil may include a multiple number of outer coil segments segmented in a circumferential direction and electrically connected with each other in parallel.

In accordance with the plasma processing apparatus of the illustrative embodiment, when the high frequency power is supplied from the high frequency power supply unit to the RF antenna, a RF magnetic field is generated around each coil conductor by a high frequency antenna current flowing in each of the inner antenna coil and the outer antenna coil of the RF antenna, and an induced electric field by a high frequency electric discharge of the processing gas is generated in the processing chamber. Herein, the RF antenna includes one or more of coil segments connected electrically in parallel to one another, and, thus, a wavelength effect within the RF antenna and a voltage drop depend on a length of the coil segments. Therefore, the coil segment number or the coil segment length within each coil is set so as not to allow the occurrence of the wavelength effect within the individual coil segments and also so as not to increase the voltage drop. Regarding a magnetomotive force within the RF antenna, a self-inductance of coil segments of each coil is set to be substantially equal to one another, so that a regular or uniform high frequency current flows in the circumferential direction of the coil. Thus, it is possible to obtain a uniform plasma density distribution in the circumferential direction.

Meanwhile, an induced electromotive force is generated within a floating coil by an electromagnetic induction between each coil segment of the RF antenna and the floating coil, and, thus, an induced current flows in the floating coil. An induced electric field is generated in a plasma generation space within the processing chamber by the induced current flowing in the floating coil, and the induced electric field is negatively or positively involved in the high frequency electric discharge of the processing gas or inductively coupled plasma generation.

An operation of the floating coil on a density distribution of plasma (donut-shaped plasma) generated in the processing chamber by an inductive coupling depends on a relatively positional relationship between the RF antenna and the floating coil and also a magnitude or a direction of the electric current flowing in the floating coil.

A magnitude and a phase (direction) of the electric current flowing in the floating coil depend on the induced electromotive force generated in a loop of the floating coil and impedance in the loop. In this plasma processing apparatus, the impedance, particularly a reactance, in the loop is adjusted and the magnitude or the direction of the electric current in the loop is controlled by electrostatic capacitance of a capacitor provided in the loop of the floating coil.

By using the floating coil having the capacitor, it is possible to variously control the plasma density distribution in the donut-shaped plasma in the radial direction as desired. Accordingly, it is possible to accurately control the plasma density distribution around the substrate on the substrate holding unit as desired, and it is possible to increase uniformity of a plasma process.

In accordance with the plasma processing apparatus of the illustrative embodiment, in an inductively coupled plasma processing apparatus, it is possible to accurately control the plasma density distribution as desired by using the coil in an electrically floating state while suppressing the wavelength effect within the RF antenna by the above-described configuration and operation.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
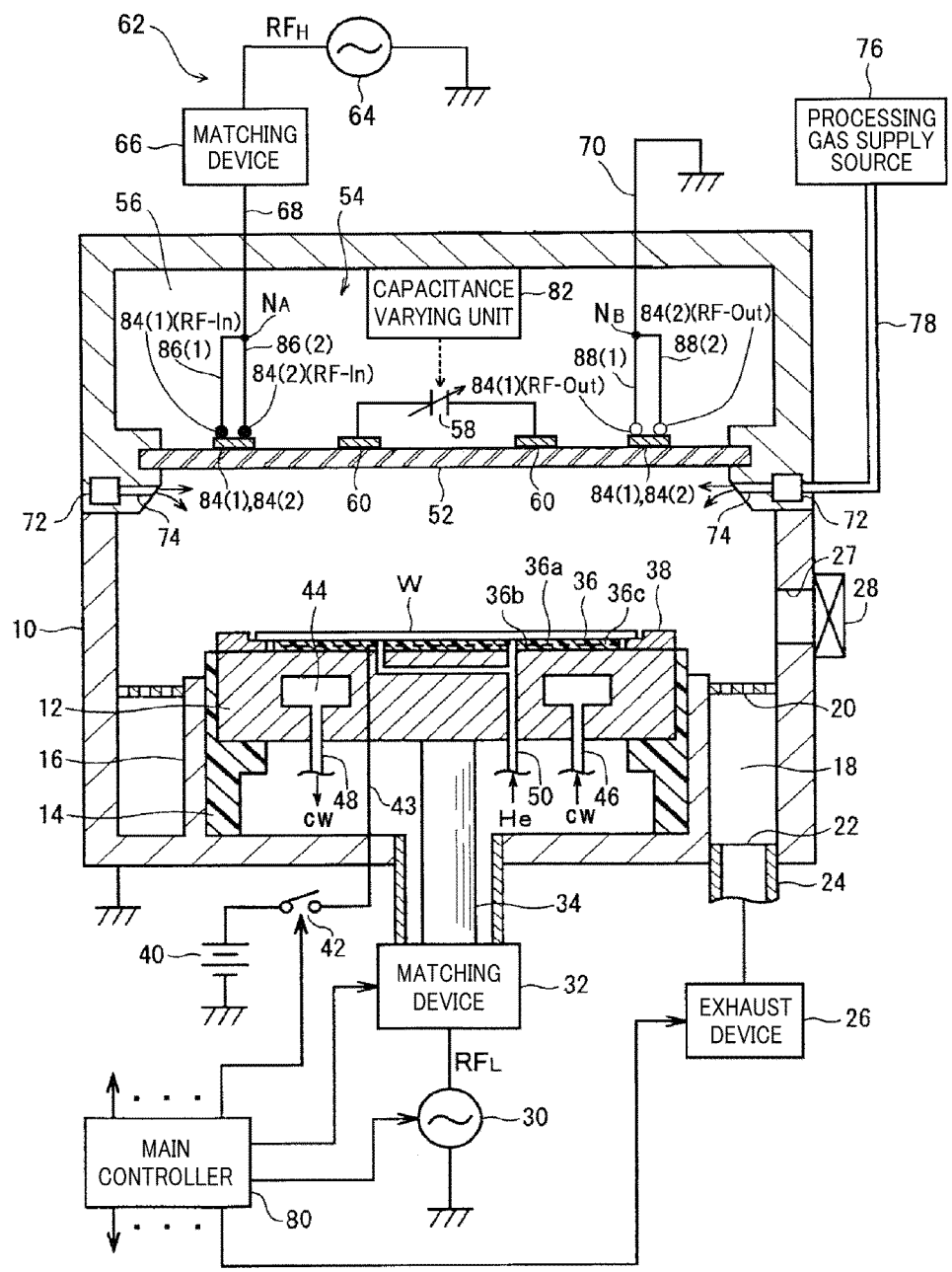
FIG. 1 is a longitudinal cross-sectional view illustrating a configuration of an inductively coupled plasma processing apparatus in accordance with a first illustrative embodiment.
Figure 2:
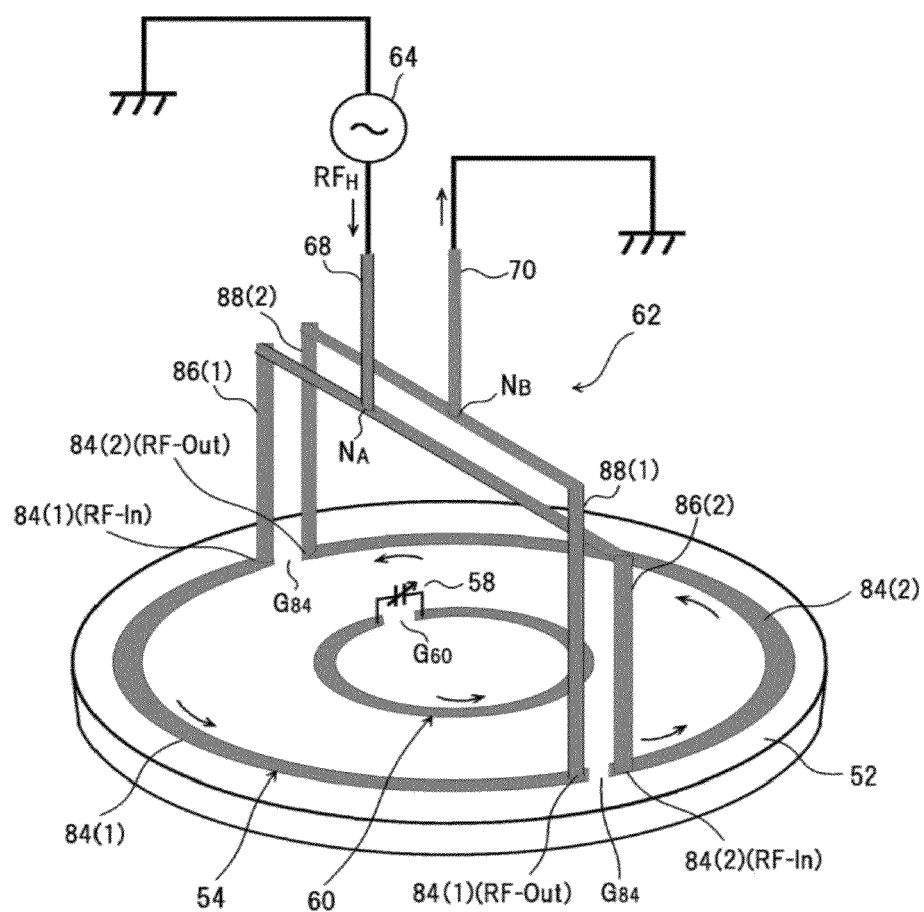
FIG. 2 is a perspective view illustrating an arrangement (layout) and an electric connection of an RF antenna and a floating coil in the plasma processing apparatus of FIG. 1.
Figure 3:
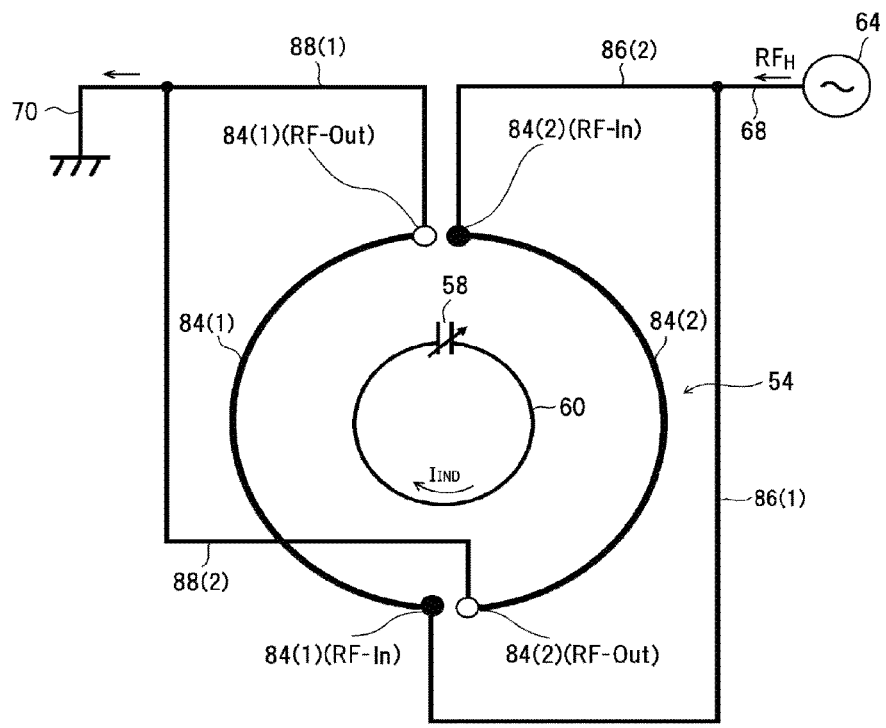
FIG. 3 is a schematic plane view illustrating the arrangement (layout) and the electric connection of the RF antenna and the floating coil in the plasma processing apparatus of FIG. 1.
Figure 3:
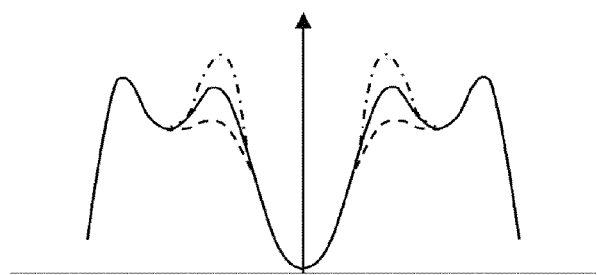

Hereinafter, illustrative embodiments will be described with reference to the accompanying drawings First Illustrative Embodiment FIG. 1 illustrates a configuration of an inductively coupled plasma processing apparatus in accordance with first illustrative embodiment. FIGS. 2 and 3 illustrate an arrangement (layout) and an electric connection of an RF antenna and a floating coil in this plasma processing apparatus.

This inductively coupled plasma processing apparatus is configured as an inductively coupled plasma etching apparatus using a planar coil RF antenna. By way of example, the plasma etching apparatus includes a cylindrical vacuum chamber (processing vessel) 10 made of metal such as aluminum or stainless steel. The chamber 10 is frame grounded.

Above all, there will be explained a configuration of each component which is not related to plasma generation in this inductively coupled plasma etching apparatus.

At a lower central region within the chamber 10, a circular plate-shaped susceptor 12 is provided horizontally. The susceptor 12 mounts thereon a target substrate such as a semiconductor wafer W and serves as a high frequency electrode as well as a substrate holding unit. This susceptor 12 is made of, for example, aluminum and is supported by a cylindrical insulating support 14 extended uprightly from a bottom of the chamber 10.

Between an inner wall of the chamber 10 and a cylindrical conductive support 16 which is extended uprightly from a bottom of the chamber 10 along the periphery of the cylindrical insulating support 14, an annular exhaust line 18 is provided. Further, an annular baffle plate 20 is provided at an upper portion or an inlet of the exhaust line 18. Furthermore, an exhaust port 22 is formed in a bottom portion. In order for a gas flow within the chamber 10 to be uniformized with respect to an axis of the semiconductor wafer W on the susceptor 12, multiple exhaust ports 22 equi-spaced from each other along a circumference are provided. Each exhaust port 22 is connected to an exhaust device 26 via an exhaust pipe 24. The exhaust device 26 includes a vacuum pump such as a turbo molecular pump or the like. Thus, it is possible to depressurize a plasma generation space within the chamber 10 to a required vacuum level. At an outside of a sidewall of the chamber 10, a gate valve 28 configured to open and close a loading/unloading port 27 of the semiconductor wafer W is provided.

The susceptor 12 is electrically connected to a high frequency power supply 30 for RF bias via a matching device 32 and a power supply rod 34. This high frequency power supply 30 is configured to output a variable high frequency power $RF_L$ having a frequency (typically, about 13.56 MHz or less) suitable for controlling energies of ions attracted toward the semiconductor wafer W. The matching device 32 includes a variable reactance matching circuit for performing matching between an impedance of the high frequency power supply 30 and an impedance of a load (mainly, susceptor, plasma and chamber). The matching circuit includes a blocking capacitor configured to generate a self-bias.

An electrostatic chuck 36 for holding the semiconductor wafer W by an electrostatic attraction force is provided on an upper surface of the susceptor 12. Further, a focus ring 38 is provided around the electrostatic chuck 36 to annularly surround the periphery of the semiconductor wafer W. The electrostatic chuck 36 includes an electrode 36a embedded between a pair of insulating films 36b and 36c, and the electrode 36a is made of a conductive film. A high voltage DC power supply 40 is electrically connected to the electrode 36a via a switch 42 and a coated line 43. By applying a high DC voltage from the DC power supply 40, the semiconductor wafer W can be attracted to and held on the electrostatic chuck 36 by the electrostatic force.

A circular ring-shaped coolant path 44 is formed within the susceptor 12. A coolant such as cooling water cw of a certain temperature is supplied into and circulated through the coolant path 44 from a chiller unit (not illustrated) via lines 46 and 48. By adjusting the temperature of the cooling water cw, it is possible to control a process temperature of the semiconductor wafer W held on the electrostatic chuck 36. Further, a heat transfer gas such as a He gas is supplied from a heat transfer gas supply unit (not illustrated) into a space between an upper surface of the electrostatic chuck 36 and a rear surface of the semiconductor wafer W through a gas supply line 50. Furthermore, an elevating mechanism (not shown) including lift pins configured to move up and down vertically through the susceptor 12 is provided to load and unload the semiconductor wafer W.

Hereinafter, there will be explained a configuration of each component which is related to plasma generation in this inductively coupled plasma etching apparatus.

A ceiling or a ceiling plate of the chamber 10 is separated relatively far from the susceptor 12. A circular dielectric window 52 such as a quartz plate is airtightly provided as the ceiling plate. Above the dielectric window 52, an antenna chamber 56 is provided as a part of the chamber 10. The antenna chamber 56 accommodates therein a RF antenna 54 and shields electromagnetically this RF antenna 54 from the outside. The RF antenna 54 is configured to generate inductively coupled plasma within the chamber 10. A detailed configuration and an operation of the RF antenna 54 will be explained later.

In order to variably control a density distribution of inductively coupled plasma in a radial direction within the processing space of the processing chamber 10, provided within the antenna chamber 56 is an annular floating coil 60 having a variable capacitor 58 that is coupled to the RF antenna 54 by an electromagnetic induction. The variable capacitor 58 is varied in a certain range by a capacitance varying unit 82 under the control of a main controller 80.

A high frequency power supply unit 62 includes a high frequency power supply 64, a matching device 66, a high frequency power supply line 68, and a return line 70. The high frequency power supply line 68 electrically connects an output terminal of the matching device 66 with a RF input terminal of the RF antenna 54. The return line 70 as an earth line is electrically grounded. The return line 70 electrically connects a RF output terminal of the RF antenna with a ground potential member (for example, the processing chamber 10 or other members) which is electrically grounded.

The high frequency power supply 64 is capable of outputting a variable high frequency power $RF_H$ having a frequency (typically, equal to or higher than about 13.56 MHz) for generating plasma by an inductively coupled high frequency electric discharge. The matching device 66 has a reactance-variable matching circuit for performing matching between an impedance of the high frequency power supply 64 and an impedance of load (mainly, RF antenna or plasma).

A processing gas supply unit for supplying a processing gas into the chamber 10 includes an annular manifold or buffer unit 72; multiple sidewall gas discharge holes 74; and a gas supply line 78. The buffer unit 72 is provided at an inside (or outside) of the sidewall of the chamber 10 to be located at a position slightly lower than the dielectric window 52. The sidewall gas discharge holes 74 are formed along a circumference at a regular interval and opened to the plasma generation space from the buffer unit 72. The gas supply line 78 is extended from a processing gas supply source 76 to the buffer unit 72. The processing gas supply source 76 includes a flow rate controller and an opening/closing valve (not shown).

The main controller 80 includes, for example, a micro computer and controls an operation of each component within this plasma etching apparatus, for example, the exhaust device 26, the high frequency power supplies 30 and 64, the matching devices 32 and 66, the switch 42 for the electrostatic chuck, the processing gas supply source 76, the capacitance varying unit 82, the chiller unit (not shown), and the heat transfer gas supply unit (not shown) as well as a whole operation (sequence) of the apparatus.

In order to perform an etching process in this inductively coupled plasma etching apparatus, after opening the gate valve 28, the semiconductor wafer W as a processing target object is loaded into the chamber 10 and mounted on the electrostatic chuck 36. Then, after closing the gate valve 28, an etching gas (generally, an mixture gas) is introduced into the chamber 10 from the processing gas supply source 76 via the gas supply line 78, the buffer unit 72, and the sidewall gas discharge holes 74 at a certain flow rate and a flow rate ratio. Subsequently, an internal pressure of the chamber 10 is controlled to be a certain level by the exhaust device 26. Further, the high frequency power supply 64 of the high frequency power supply unit 62 is turned on, and the high frequency power $RF_H$ for plasma generation is outputted at a certain RF power level. An electric current of the high frequency power $RF_H$ is supplied to the RF antenna 54 through the matching device 66, the RF power supply line 68 and the return line 70. Meanwhile, the high frequency power supply 30 is turned on to output the high frequency power $RF_L$ for ion attraction control at a certain RF power level. This high frequency power $RF_L$ is applied to the susceptor 12 via the matching device 32 and the power supply rod 34. Further, a heat transfer gas (a He gas) is supplied to a contact interface between the electrostatic chuck 36 and the semiconductor wafer W from the heat transfer gas supply unit. Furthermore, the switch 42 is turned on, and then, the heat transfer gas is confined in the contact interface by the electrostatic force of the electrostatic chuck 36.

Within the chamber 10, an etching gas discharged from sidewall gas discharge holes 74 is diffused into a processing space below the dielectric window 52. By the electric current of the high frequency power $RF_H$ flowing in coil segments to be described below and an induced current flowing in the floating coil 60, magnetic force lines (magnetic flux) are transmitted to the processing space (plasma generation space) within the chamber 10 via the dielectric window 52. An induced electric field is generated in an azimuth direction within the processing space. Then, electrons accelerated by this induced electric field in the azimuth direction collide with molecules or atoms of the etching gas so as to be ionized. In the process, donut-shaped plasma is generated.

Radicals or ions in the donut-shaped plasma are diffused in all directions within the large processing space. To be specific, while the radicals are isotropically introduced and the ions are attracted by a DC bias, the radicals and the ions are supplied on an upper surface (target surface) of the semiconductor wafer W. Accordingly, plasma active species perform chemical and physical reactions on the target surface of the semiconductor wafer W so as to etch a target film into a required pattern.

Herein, "donut-shaped plasma" is not limited to only ring-shaped plasma which is generated only at the radial outside in the chamber 10 without being generated at the radial inside (at a central area) therein. Further, "donut-shaped plasma" includes a state where a volume or a density of the plasma generated at the radial outside is greater than that at the radial inside. Further, depending on a kind of a gas used for the processing gas, an internal pressure of the chamber 10, or the like, the plasma has other shapes instead of the "donut shape."

In this inductively coupled plasma etching apparatus, the RF antenna 54 is configured to have a specific spatial layout and electric connection as described below, and in order to control a plasma density distribution around the susceptor 12 in a radial direction, the main controller 80 controls the capacitance varying unit 82 to vary an electrostatic capacitance of the variable capacitor 58 in a loop of the floating coil 60 according to certain process parameters (for example, a pressure, a RF power, a gas flow rate, or the like) set in a process recipe.

[Basic Configuration and Operation of RF Antenna and Floating Coil]

FIGS. 2 and 3 illustrate an arrangement (layout) and an electric connection of an RF antenna and a floating coil in this plasma processing apparatus.

Desirably, each of these the RF antenna 54 includes a multiple number of (for example, two) coil segments 84(1) and 84(2) segmented in a circumferential direction. Spatially, each of these coil segments 84(1) and 84(2) has a semicircular shape. Further, these two coil segments 84(1) and 84(2) are arranged in series to be extended along one round in the circumferential direction or along the most of one round in the circumferential direction. To elaborate, in an one-round loop of the RF antenna 54, a RF input terminal 84(1)(RF-In) of the first coil segment 84(1) and a RF output terminal 84(2)(RF-Out) of the second coil segment 84(2) are positioned adjacently or face to each other with a gap $G_{84}$ in the circumferential direction. Further, a RF output terminal 84(1)(RF-Out) of the first coil segment 84(1) and a RF input terminal 84(2) (RF-In) of the second coil segment 84(2) are positioned adjacently or face to each other with a gap $G_{84}$ in the circumferential direction.

One ends of the coil segments 84(1) and 84(2), i.e., the RF input terminals 84(1)(RF-In) and 84(2)(RF-In) are electrically connected with the RF power supply line 68 led from the high frequency power supply unit 62 via upwardly extending connection conductors 86(1) and 86(2) and a node $N_A$ on a high frequency input side, respectively. Further, the other ends of the coil segments 84(1) and 84(2), i.e., the RF output terminals 84(1)(RF-Out) and 84(2)(RF-Out) are electrically connected with the earth line 70 via upwardly extending connection conductors 88(1) and 88(2) and a node $N_B$ on a high frequency output side, respectively. As described above, within the antenna chamber 56, the connection conductors 86(1), 86(2), 88(1), and 88(2) upwardly extending from the RF antenna 54 serve as branch lines or connecting lines in horizontal directions while spaced apart from the dielectric window 52 at a sufficiently large distance (i.e., at considerably high positions). Accordingly, electromagnetic influence upon the coil segments 84(1) and 84(2) can be reduced.

In this way, between the RF power supply line 68 of the high frequency power supply unit 62 and the earth line 70 of the ground potential member or between the node $N_A$ and the node $N_B$, the two coil segments 84(1) and 84(2) of the RF antenna 54 are electrically connected to each other in parallel. Between the node $N_A$ and the node $N_B$, respective components of the RF antenna 54 are connected such that directions of high frequency antenna currents flowing in the coil segments 84(1) and 84(2) are all the same in the circumferential direction.

In accordance with the present illustrative embodiment, the two coil segments 84(1) and 84(2) of the RF antenna 54 have substantially the same self-inductance. Typically, by using the coil segments 84(1) and 84(2) having the same materials, diameters and lengths, the self-inductances of the coil segments 84(1) and 84(2) can be set to be same or approximate to each other.

The floating coil 60 is in an electrically floating state and provided inside the RF antenna 54. In the present illustrative embodiment, the electrically floating state indicates a state of being electrically floated or separated from a power supply and a ground (ground potential) and a state where no or few charge or electric current is exchanged with a surrounding conductor and only an induced current may flow by an electromagnetic induction.

As a basic configuration, the floating coil 60 includes a single-wound (or multi-wound) coil having a gap $G_{60}$ between both ends of the floating coil 60. The variable capacitor 58 is provided at the gap $G_{60}$. Desirably, a coil conductor of the floating coil 60 is made of metal having high conductivity such as silver-plated copper.

As will be described later, the variable capacitor 58 may be of a commercially available general-purpose type, such as a varicon (variable condenser) or a varicap (variable capacitor) or a specially customized product or a uniquely manufactured product provided in the floating coil as a part thereof. The capacitance varying unit 82 variably controls an electrostatic capacitance of the variable capacitor 58 by, typically, a mechanical driving mechanism or an electric driving circuit.

In the present illustrative embodiment, desirably, both the RF antenna 54 and the floating coil 60 have a loop shape (for example, a circular ring shape in the drawings) similar to each other. Further, both the RF antenna 54 and the floating coil 60 are arranged to be coaxial to each other and concentrically on the dielectric window 52.

In the illustrative embodiments, the term "coaxial" means that central axes of multiple objects having axisymmetric shape are aligned with each other. As for multiple coils, respective coils surfaces may be offset with each other in an axial direction or may be arranged on the same plane (positioned concentrically).

In the inductively coupled plasma etching apparatus in accordance with the present illustrative embodiment, a high frequency antenna current supplied from the high frequency power supply unit 62 flows through the respective components in the RF antenna 54, and an induced current flows through the floating coil 60. As a result, high frequency AC magnetic fields distributed in loop shapes are formed around the coil segments 84(1) and 84(2) of the RF antenna 54 according to the Ampere's Law. Further, under the dielectric window 52, magnetic force lines passing through the processing space in a radial direction are formed even in a relatively lower region.

In this case, a radial directional (horizontal) component of a magnetic flux density in the processing space may be zero (0) constantly at a central region and a periphery of the chamber 10 regardless of a magnitude of the high frequency current. Further, the radial directional (horizontal) component of a magnetic flux density in the processing space has a maximum value at a certain portion therebetween. An intensity distribution of the induced electric field in the azimuth direction generated by the AC magnetic field of the high frequency has the same pattern as a magnetic flux density distribution in a radial direction. That is, an electron density distribution within the donut-shaped plasma in the radial direction substantially corresponds to an electric current distribution within the RF antenna 54 (coil segments 84(1) and 84(2)) and the floating coil 60 in a macro view.

In the RF antenna 54, as described above, the coil segments 84(1) and 84(2) have substantially the same self-inductance (i.e. substantially the same impedance) and are electrically connected in parallel to each other. Accordingly, when plasma is generated, an antenna current $I_{RF}$ is constantly uniform over a half loop of the first coil segment 84(1) and a half loop of the second coil segment 84(2), and the antenna current $I_{RF}$ is uniform over the entire RF antenna 54, i.e. within one loop of the RF antenna 54. Further, an induced current $I_{IND}$ is constantly uniform within one loop of the floating coil 60.

Therefore, in the donut-shaped plasma generated below (inside) the dielectric window 52 of the chamber 10, an electric current density (i.e. plasma density) is remarkably increased (maximized) in regions near positions directly under the RF antenna 54 (coil segments 84(1) and 84(2)) and the floating coil 60. Thus, an electric current density distribution within the donut-shaped plasma is not uniform in a radial direction and has an uneven profile. However, since the plasma is diffused in all directions within the processing space of the chamber 10, a plasma density in a vicinity of the susceptor 12, i.e. on the substrate W, becomes very uniform.

In the present illustrative embodiment, the regular or uniform antenna current $I_{RF}$ and the induced current $I_{IND}$ flow within the loops of the RF antenna 54 (coil segments 84(1) and 84(2)) and the floating coil 60, respectively. Thus, a plasma density distribution can constantly be uniformized in the circumferential directions in the vicinity of the susceptor 12, i.e., on the substrate W as well as within the donut-shaped plasma.

Further, in the radial direction, by variably controlling the electrostatic capacitance of the variable capacitor 58 by the capacitance varying unit 82 under the control of the main controller 80, it is possible to adjust a direction and a magnitude of the induced current $I_{IND}$ flowing in the floating coil 60 as desired. Thus, it is possible to control a plasma density in a region near a position directly under the floating coil 60. Further, since the donut-shaped plasma is diffused in all directions (particularly, in the radial direction) within the processing space, a plasma density distribution in a vicinity of the susceptor 12 can be variously controlled in the radial direction as desired. An operation of the floating coil 60 will be explained in detail later.

In the present illustrative embodiment, the RF antenna 54 includes the multiple number of coil segments 84(1) and 84(2) connected electrically in parallel to each other. With this configuration, a wavelength effect or a voltage drop within the RF antenna 54 depends on the length of each of the coil segments 84(1) and 84(2). Accordingly, the lengths of the coil segments 84(1) and 84(2) are determined so as not to allow the occurrence of the wavelength effect within the individual coil segments 84(1) and 84(2), and also so as not to increase the voltage drop. In this way, the problems of the wavelength effect and voltage drop within the RF antenna 54 can be all resolved. For suppressing the wavelength effect, it is desirable to set the length of each of the coil segments 84(1) and 84(2) to be shorter (more desirably, much shorter) than about ¼ of a wavelength of the high frequency power $RF_H$.

As described above, in the RF antenna 54 of the present illustrative embodiment, it is difficult for the wavelength effect to occur and the potential difference (voltage drop) generated within the antenna becomes small. Thus, by capacitive coupling between the RF antenna 54 and the plasma, a difference in ion impacts on respective parts of the dielectric window 52 can be reduced. Hence, it is also possible to achieve an effect of reducing an undesirable phenomenon that a part of the dielectric window 52 is locally or intensively etched.

Figure 4:
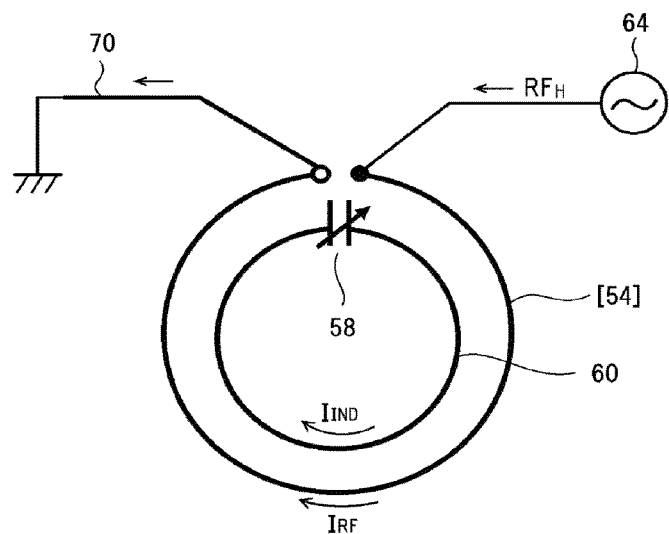
FIG. 4 illustrates a model (basic configuration) for explaining an operation when an electrostatic capacitance of a variable capacitor is varied in the floating coil.

An operation of the floating coil 60 on plasma generation, particularly, when the electrostatic capacitance of the variable capacitor 58 is varied, it may be easily understood by using a simple model (basic configuration) shown in FIG. 4. In the present illustrative embodiment, the RF antenna 54 including the multiple number of (two) coil segments 84(1) and 84(2) has the same diameter as a circular ring-shaped single-wound coil [54] shown in FIG. 4, and the RF antenna 54 has the same operation as the single-wound coil [54] on inductively coupled plasma generation.

In the model depicted in FIG. 4, when a high frequency power $RF_H$ of a certain frequency f is supplied from the high frequency power supply 64 to the RF antenna 54 and an antenna current $I_{RF}$ flows in the RF antenna 54, an electromotive force, i.e. an induced electromotive force $V_{IND}$, generated in the floating coil 60 by an electromagnetic induction is expressed by the following equation (1) from Faraday's law.

[Equation 1]

$$V_{IND} = d\Phi/dt = -i\omega M I_{RF} \qquad (1)$$

Herein, $\omega$ denotes an angular frequency ($\omega=2\pi f$), and M denotes a mutual inductance between the RF antenna 54 and the floating coil 60. Here, since a mutual inductance between the floating coil 60 and the plasma is relatively small, the mutual inductance between the floating coil 60 and the plasma is ignored in the equation (1).

The electric current (induced current) $I_{IND}$ flowing in the floating coil 60 by the induced electromotive force $V_{IND}$ is expressed by the following equation (2).

[Equation 2]

$$I_{IND} = V_{IND}/Z_{60} = -iM\omega I_{RF}/\{R_{60} + (L_{60}\omega - 1/C_{58}\omega)\} \qquad (2)$$

Herein, $Z_{60}$ denotes an impedance of the floating coil 60, $R_{60}$ denotes a resistance (including a resistance component caused by a power absorbed into the plasma) of the floating coil 60, $L_{60}$ denotes a self-inductance of the floating coil 60, and $C_{58}$ denotes an electrostatic capacitance of the variable capacitor 58.

Since the equation, $|R_{60}| \leq |L_{60}\omega - 1/C_{58}\omega|$, is satisfied in the floating coil 60 of a typical material and structure to be used for a typical purpose, the induced current $I_{IND}$ is expressed by the following approximation equation (3).

[Equation 3]

$$I_{IND} \approx -M\omega I_{RF}/(L_{60}\omega - 1/C_{58}\omega) \qquad (3)$$

The approximation equation (3) indicates that a direction of the induced current $I_{IND}$ flowing in the floating coil 60 is changed in the circumferential direction depending on the electrostatic capacitance $C_{58}$ of the variable capacitor 58. That is, if the electrostatic capacitance $C_{58}$ of the variable capacitor 58 obtained when a series resonance occurs in the floating coil 60 is denoted as $C_R$, when the electrostatic capacitance $C_{58}$ is greater than $C_R$, $L_{60}\omega > 1/C_{58}\omega$, i.e. a reactance $(L_{60}\omega - 1/C_{58}\omega)$ in the floating coil 60 has a positive value. Thus, a negative induced current $I_{IND}$ flows in the floating coil 60 (in a direction opposite to the antenna current $I_{RF}$ in the circumferential direction). However, when $C_{58}$ is smaller than $C_R$, $L_{60}\omega < 1/C_{58}\omega$, i.e. the reactance $(L_{60}\omega - 1/C_{58}\omega)$ in the floating coil 60 has a negative value. Thus, a positive induced current $I_{IND}$ flows in the floating coil 60 (in the same direction as the antenna current $I_{RF}$ flowing in the RF antenna 54 in the circumferential direction). This feature is illustrated in a graph (plot diagram) of FIG. 5.

Figure 5:
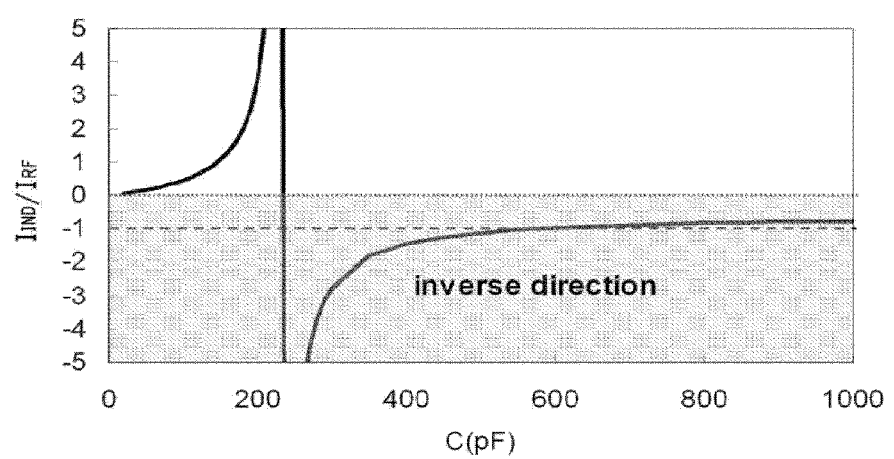
FIG. 5 is a characteristic graph of a ratio of an induced current to an antenna current when the electrostatic capacitance of the variable capacitor is varied in the floating coil.

In the graph of FIG. 5, a horizontal axis denotes the electrostatic capacitance $C_{58}$ of the variable capacitor 58, and the electrostatic capacitance $C_{58}$ is continuously varied from about 20 pF to about 1000 pF. A vertical axis denotes a ratio $I_{IND}/I_{RF}$ of the induced current $I_{IND}$ to the antenna current $I_{RF}$. The ratio indicates that how many times the induced current $I_{IND}$ flowing in the floating coil 60 is greater or smaller than the antenna current $I_{RF}$ flowing in the RF antenna 54. When the electric current ratio $I_{IND}/I_{RF}$ has a positive value, the induced current $I_{IND}$ flows in the same direction as the antenna current $I_{RF}$ in the circumferential direction. On the contrary, when the electric current ratio $I_{IND}/I_{RF}$ has a negative value, the induced current $I_{IND}$ flows in a direction opposite to the antenna current $I_{RF}$ in the circumferential direction. In a calculation example from the graph, $f(\omega/2\pi)=13.56$ MHz, $M=350$ nH, and $L_{60}=580$ nH. In this case, the electrostatic capacitance $C_R$ of the electrostatic capacitance $C_{58}$ when the series resonance occurs in the floating coil 60 is calculated as $C_R \approx 230$ pF from a resonance condition of $L_{60}\omega = 1/C_R\omega$.

As shown in FIG. 5, when the electrostatic capacitance $C_{58}$ of the variable capacitor 58 is about 20 pF, the induced current $I_{IND}$ has a positive value close to about 0. If the electrostatic capacitance $C_{58}$ is increased from about 20 pF, the induced current $I_{IND}$ is gradually increased in a positive direction (in the same direction as the antenna current $I_{RF}$), and, thus, the induced current $I_{IND}$ is larger than the antenna current $I_{RF}$. Thereafter, the induced current $I_{IND}$ is exponentially increased and has a maximum value right before the electrostatic capacitance $C_{58}$ becomes equal to the electrostatic capacitance $C_R$ when the series resonance occurs. Then, when the electrostatic capacitance $C_{58}$ is larger than the electrostatic capacitance $C_R$, the large induced current $I_{IND}$ flows in an inverse direction (in a direction opposite to the antenna current $I_{RF}$). Further, if the electrostatic capacitance $C_{58}$ is increased, the induced current $I_{IND}$ is logarithmically decreased in the inverse direction. Finally, the induced current $I_{IND}$ gradually approaches a saturation current $I_S$ smaller than the antenna current $I_{RF}$ in an absolute value. Herein, the saturation value $I_S$ is expressed by $I_S \approx MI_{RF}/L_{60}$, and in the above-described calculation example (M=350 nH, $L_{60}$=580 nH), $I_S \approx 0.6\ I_{RF}$.

An important operation of the floating coil 60 is that a direction of the induced current $I_{IND}$ is changed depending on the electrostatic capacitance $C_{58}$ of the variable capacitor 58 and then an effect (operational effect) on a plasma density distribution in the donut-shaped plasma generated within the chamber 10 is highly changed.

That is, when the induced current $I_{IND}$ flows in a direction opposite to the antenna current $I_{RF}$ in the circumferential direction of the floating coil 60, induced magnetic field intensity or an inductively coupled plasma density in a region near a position directly under the coil is locally decreased. As a magnitude of the induced current $I_{IND}$ is increased, the plasma density is greatly decreased.

On the contrary, when the induced current $I_{IND}$ flows in the same direction as the antenna current $I_{RF}$ in the circumferential direction of the floating coil 60, the induced magnetic field intensity or the inductively coupled plasma density in the region near the position directly under the coil conductor is locally increased. As the magnitude of the induced current $I_{IND}$ is increased, the plasma density is greatly increased.

Therefore, by varying the electrostatic capacitance $C_{58}$ of the variable capacitor 58, while the floating coil 60 is fixed at a certain position, it is possible to control a plasma density distribution of the donut-shaped plasma generated within the chamber 10 as desired. Further, a plasma density distribution of the donut-shaped plasma diffused in all directions (particularly, in the radial direction) within the processing space can be variously controlled in a vicinity of the susceptor 12 as desired.

Further, as described above, since the induced current $I_{IND}$ flows in the same direction as the antenna current $I_{RF}$ in the circumferential direction of the floating coil 60, the floating coil 60 exhibits a positive or plus effect on inductively coupled plasma generation as well as the RF antenna 54, and RF power supply efficiency is increased. That is, by using the operation of the floating coil 60 on the inductively coupled plasma generation, a burden to the RF antenna 54 is decreased, so that a magnitude of the high frequency current $I_{RF}$ supplied to the RF antenna 54 is decreased. Accordingly, it is possible to decrease a power loss of the high frequency power $RF_H$ at each component (particularly, the matching device 66 and the high frequency power supply line 68) of a high frequency power supply system.

Figure 6:
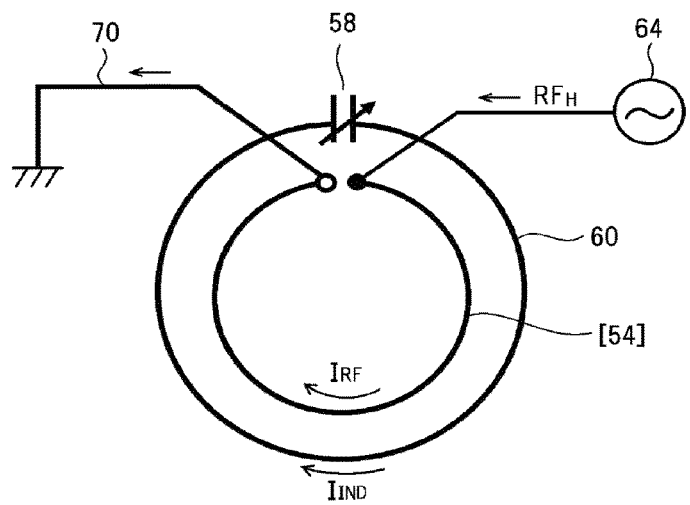
FIG. 6 illustrates a modified example of the model of FIG. 4.

In the model depicted in FIG. 4, the floating coil 60 is positioned inside the RF antenna 54 in the radial direction. However, as depicted in FIG. 6, the same effect can be obtained when the floating coil 60 is provided outside the RF antenna 54 in the radial direction. That is, if the floating coil 60 has the same mutual inductance M with respect to the RF antenna 54, the induced current $I_{IND}$ having the same magnitude flows through the floating coil 60 in the same direction regardless of whether the floating coil 60 is positioned inside or outside the RF antenna 54.

Meanwhile, if the floating coil 60 is far away from the RF antenna 54, the mutual inductance M is decreased, and the induced electromotive force $V_{IND}$ generated in the floating coil 60 is weakened (decreased). However, even in this case, if the floating coil 60 is operated at a series resonance or close to the series resonance by adjusting the electrostatic capacitance $C_{58}$ of the variable capacitor 58, an induced current $I_{IND}$ having a practically sufficient magnitude can be obtained.

When the floating coil 60 is operated at the series resonance or close to the series resonance, the approximation equation (3) is not used. Instead, the following approximation equation (4) is used.

[Equation 4]

$$I_{IND} \approx -iM\omega I_{RF}/R_{60} \quad (4)$$

As can be seen from the equation (4), when the floating coil 60 is operated at the series resonance or close to the series resonance, the induced current $I_{IND}$ has a phase difference of about 90° with respect to the antenna current $I_{RF}$. In this case, if the mutual inductance M is too small, i.e. a coefficient $(M\omega/R_{60})$ of the equation (4) is too small, the induced current $I_{IND}$ is not practical. Therefore, this coefficient $(M\omega/R_{60})$ needs to be greater than 1, i.e. needs to satisfy the following conditional equation (5).

[Equation 5]

$$M\omega > R_{60} \text{ or } 2\pi fM > R_{60} \quad (5)$$

Herein, $R_{60}$ denotes the resistance of the floating coil 60 as described above, and the resistance $R_{60}$ is the sum ($R_{60C}$+$R_{60P}$) of a resistance $R_{60C}$ of the coil conductor and a resistance $R_{60P}$ corresponding to power absorption into the plasma. Here, the former $R_{60C}$ is generally dominant, and the latter $R_{60P}$ is ignored on the design.

In theory, when the RF antenna 54 and the floating coil 60 is a circular ring-shaped single-wound coil as depicted in FIG. 4 or FIG. 6, if radiuses of the RF antenna 54 and the floating coil 60 denote a and b, respectively, and a distance between the RF antenna 54 and the floating coil 60 is denoted as d, the mutual inductance M is expressed by the following equation (6).

[Equation 6]

$$M_{12} = \mu_0 \sqrt{ab} \left( \left(\frac{2}{k} - k\right) K(k) - \frac{2}{k} E(k) \right) \quad (6)$$

herein, $$k = \frac{4ab}{(a+b)^2 + d^2}$$

$$K(k) = \int_0^{\pi/2} \frac{d\varphi}{\sqrt{1 - k^2 \sin^2 \varphi}}$$

$$E(k) = \int_0^{\pi/2} \sqrt{1 - k^2 \sin^2 \varphi}\, d\varphi$$

Figure 7:
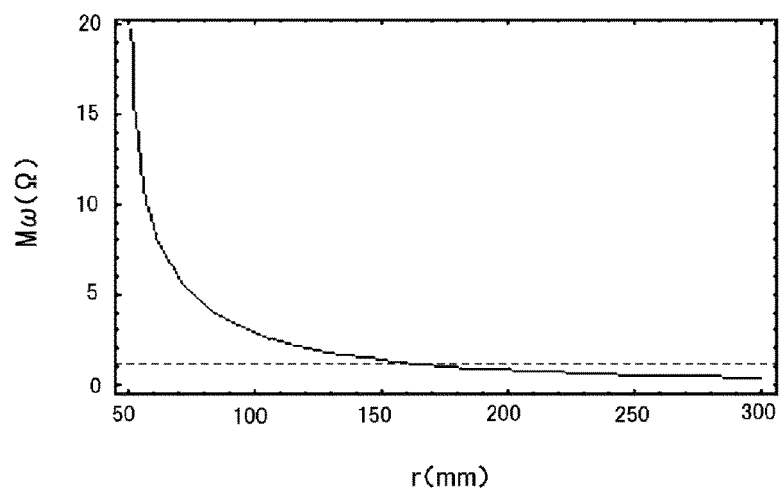
FIG. 7 shows dependence of a multiplication of a mutual inductance and an angular frequency on a radius of the floating coil in the model of FIG. 4 or FIG. 6.

By way of example, when the RF antenna 54 having a radius of about 50 mm and the floating coil 60 having a radius r are arranged to be coaxial to each other on the same plane, a multiplication $M\omega$ of the mutual inductance M calculated from the equation (6) and the angular frequency $\omega$ depends on the radius r of the floating coil 60 as depicted in FIG. 7. Herein, $f(\omega/2\pi)$=13.56 MHz.

If a resistance R of the floating coil 60 is 1(Ω) as a typical value, when r<about 150 mm from FIG. 7, i.e. the radius r of the floating coil 60 is less than about three times the radius (about 50 mm) of the RF antenna 54, Mω>1, i.e. the conditional equation (5) is satisfied.

FIG. 7 shows when the floating coil 60 is positioned outside the RF antenna 54 in the radial direction. If the floating coil 60 is positioned inside the RF antenna 54 in the radial direction, the relationship between the floating coil 60 and the RF antenna 54 is reversed. Accordingly, if the radius (about 50 mm) of the RF antenna 54 is less than about three times the radius r of the floating coil 60, Mω>1, i.e. the conditional equation (5) is satisfied. That is, if the radius r of the floating coil 60 is less than about one third times the radius of the RF antenna 54, Mω>1, i.e. the conditional equation (5) is satisfied.

Second Illustrative Embodiment

Hereinafter, a second illustrative embodiment will be explained with reference to FIGS. 8 to 10.

Figure 8:
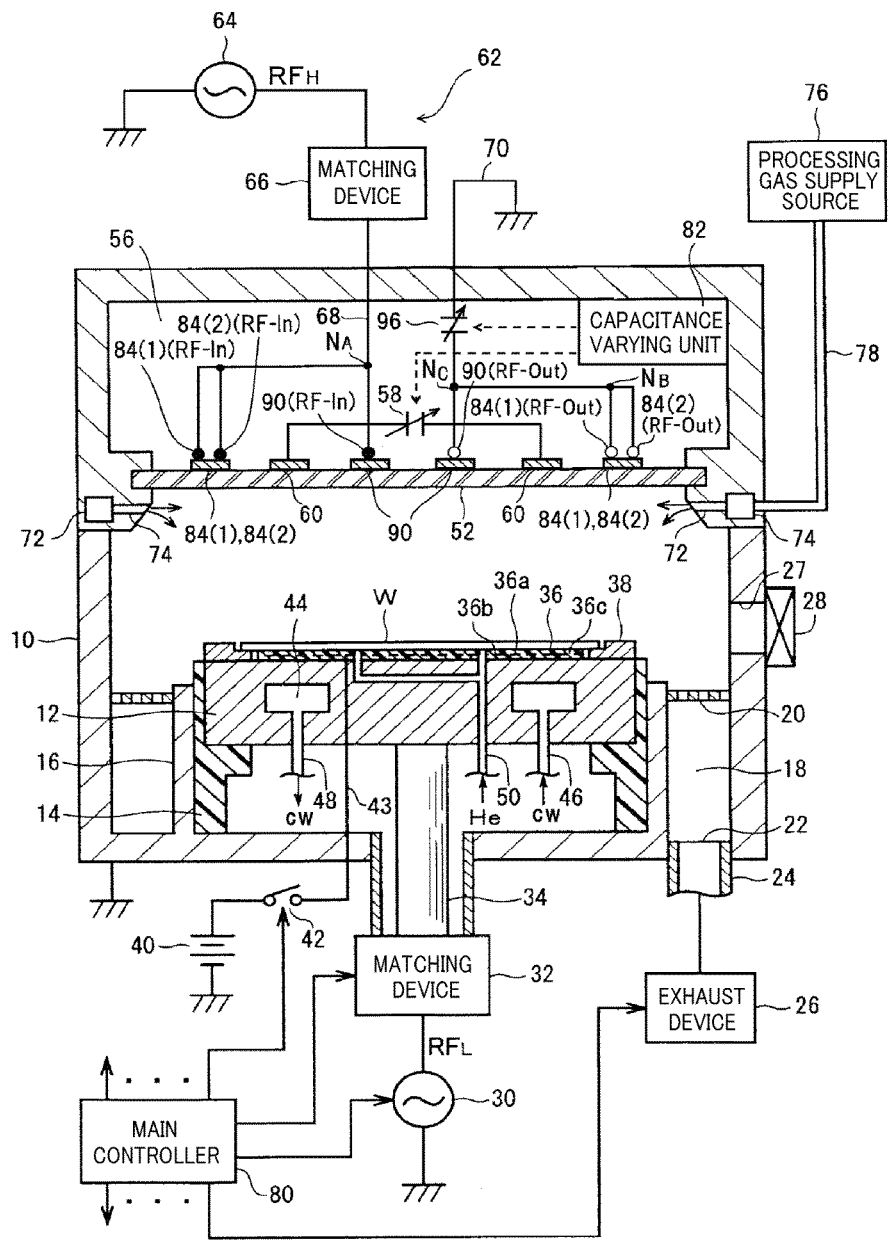
FIG. 8 is a longitudinal cross-sectional view of an inductively coupled plasma processing apparatus in accordance with a second illustrative embodiment.
Figure 9:
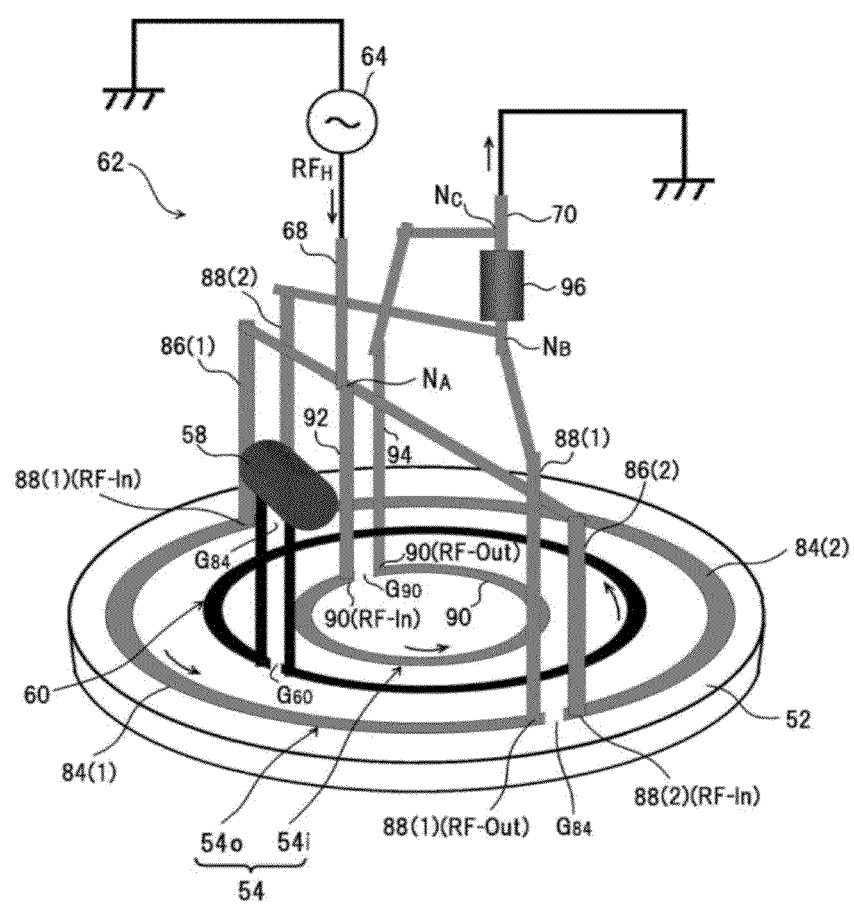
FIG. 9 is a perspective view illustrating an arrangement (layout) and an electric connection of an RF antenna and a floating coil in the plasma processing apparatus of FIG. 8.
Figure 10:
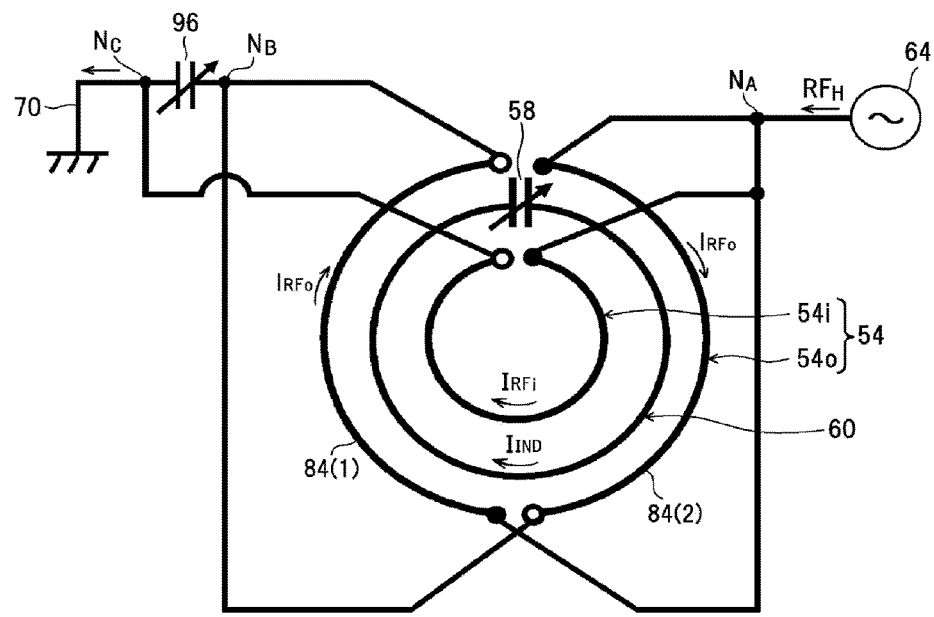
FIG. 10 is a schematic plane view illustrating the arrangement (layout) and the electric connection of the RF antenna and the floating coil in the plasma processing apparatus of FIG. 8.
Figure 10:
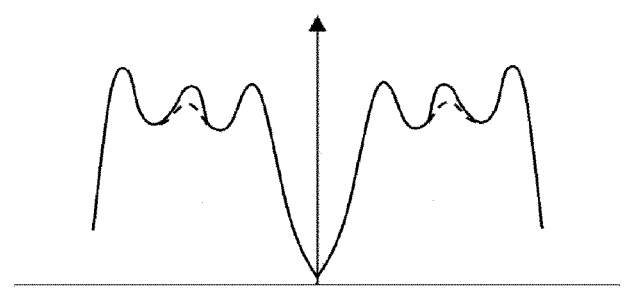

FIG. 8 illustrates a configuration of an inductively coupled plasma processing apparatus in accordance with the second illustrative embodiment, and FIGS. 9 and 10 illustrates an arrangement (layout) and an electric connection of the RF antenna 54 and the floating coil 60 in accordance with the second illustrative embodiment. In the drawings, parts having same configurations or functions as those described in the first illustrative embodiment (FIG. 1) will be assigned same reference numerals.

In the second illustrative embodiment, the RF antenna includes a circular ring-shaped inner antenna coil $54_i$ and a circular ring-shaped outer antenna coil $54_o$ each having a different radius from each other. Herein, the outer antenna coil $54_o$ has the same configuration as the RF antenna 54 in the first illustrative embodiment, i.e. the outer antenna coil $54_o$ includes a multiple number of, for example, two coil segments 84(1) and 84(2) connected electrically in parallel to each other. The coil segments 84(1) and 84(2) are spatially arranged in series to be extended along a circular ring-shaped one-round loop and provided in a vicinity of the sidewall of the chamber 10 in a radial direction.

The inner antenna coil $54_i$ includes a single circular coil segment 90 having a smaller diameter than the floating coil 60, and the inner antenna coil $54_i$, the floating coil 60 and the outer antenna coil $54_o$ are coaxial to one another on the same plane (on the dielectric window 52). This inner coil segment 90 is a single body and is annularly extended along one round in a circumferential direction or along the most of one round in the circumferential direction. Both ends 90(RF-In) and 90(RF-Out) of the inner coil segment 90 are positioned adjacently or face to each other with an inner gap $G_{90}$ therebetween in the circumferential direction. One end of the inner coil segment 90, i.e., the RF input terminal 90(RF-In) is connected with the RF power supply line 68 led from the high frequency power supply unit 62 via a connection conductor 92 and the node $N_A$ on the high frequency input side. The other end of the inner coil segment 90, i.e., the RF output terminal 90(RF-Out) is connected with the earth line 70 via an upwardly extending connection conductor 94 and the node $N_C$ on the high frequency output side. A variable capacitor 96 as an impedance control unit is connected (inserted) between the node $N_B$ and the node $N_C$.

By way of example, if the semiconductor wafer W as a processing target substrate has a diameter of about 300 mm, the inner antenna coil $54_i$, the floating coil 60, and the outer antenna coil $54_o$ are set to have diameters of about 100 mm, about 200 mm, and about 300 mm, respectively.

As described above, the inner antenna coil $54_i$ (coil segment 90), the outer antenna coil $54_o$ (coil segments 84(1) and 84(2)), and the floating coil 60 have a coil shape similar to one another. Further, the floating coil 60 is provided between the inner antenna coil $54_i$ and the outer antenna coil $54_o$, and the floating coil 60, the inner antenna coil $54_i$ and the outer antenna coil $54_o$ are coaxial to one another. With this configuration, as will be described later, it is possible to independently control a balance of an electric current split in the RF antenna 54 (between the inner antenna coil $54_i$ and the outer antenna coil $54_o$) and a direction and a magnitude (current magnitude) of the induced current $I_{IND}$ flowing in the floating coil 60.

If a mutual inductance between the floating coil 60 and the inner antenna coil $54_i$ is denoted as $M_i$ and a mutual inductance between the floating coil 60 and the outer antenna coil $54_o$ is denoted as $M_o$, $M_i$=$M_o$. Accordingly, the above-described controls can be performed independently.

When the split currents $I_{RFi}$ and $I_{RFo}$ flow in the inner antenna coil $54_i$ and the outer antenna coil $54_o$, respectively, based on the superposition theorem, the induced electromotive force $V_{IND}$ generated in the floating coil 60 becomes equal to the sum of an induced electromotive force generated in the floating coil 60 when the split current $I_{RFi}$ flows in the inner antenna coil $54_i$ and an induced electromotive force generated in the floating coil 60 when the split current $M_o$ flows in the outer antenna coil $54_o$. In this case, if the mutual inductance $M_i$ is equal to the mutual inductance $M_o$, from the equations (1), (2) and (3), it can be seen that not only the induced electromotive force but also the induced current $I_{IND}$ generated in the floating coil 60 depends on the sum of the split currents ($I_{RFi}$+$I_{RFo}$) regardless of a ratio $I_{RFi}/I_{RFo}$ of the split currents $I_{RFi}$ and $I_{RFo}$.

Further, since the floating coil 60 is positioned between (desirably, in the middle of) the inner antenna coil $54_i$ and the outer antenna coil $54_o$, i.e. positioned close to the both antenna coils $54_i$ and $54_o$, the both mutual inductances $M_i$ and $M_o$ are increased.

In the second illustrative embodiment, in order to control the balance (ratio) of the split currents $I_{RFi}$ and $I_{RFo}$ respectively flowing in the inner antenna coil $54_i$ and the outer antenna coil $54_o$ of the RF antenna 54 as desired, the variable capacitor 96 is provided between the node $N_B$ and the node $N_C$. The variable capacitor 96 is connected in parallel with the inner antenna coil $54_i$ and connected in series with the outer antenna coil $54_o$, and an electrostatic capacitance $C_{96}$ of the variable capacitor 96 is variably controlled by the capacitance varying unit 82 under the control of the main controller 80.

That is, if an impedance of the inner antenna coil $54_i$ denoted as $Z_i$ and a combined impedance of the outer antenna coil $54_o$ and the variable capacitor 96 is denoted as $Z_o$, the balance (ratio) of the split currents $I_{RFi}$ and $I_{RFo}$ in the antenna is determined by a ratio of the impedances as in the following equation (7) and does not have an effect on the induced current $I_{IND}$ flowing in the floating coil 60.

[Equation 7]

$$I_{RFi}:I_{RFo}=(1/Z_i):(1/Z_o) \tag{7}$$

In the present illustrative embodiment, most of the high frequency current supplied from the high frequency power supply unit 62 to the RF antenna 54 is split to the inner antenna coil $54_i$ and the outer antenna coil $54_o$. Here, by varying the electrostatic capacitance $C_{96}$ of the variable capacitor 96, the combined impedance $Z_0$ of the outer antenna coil $54_o$ and the variable capacitor 96 can be varied, and, a split ratio between the inner antenna current $I_{RFi}$ and the outer antenna current $I_{RFo}$ can be also adjusted.

To be more specific, the inner antenna current $I_{RFi}$ flowing in the inner antenna coil $54_i$ and the outer antenna current $I_{RFo}$ flowing in the outer antenna coil $54_o$ are typically set to flow in the same direction in the circumferential direction. In order to do so, the electrostatic capacitance $C_{96}$ of the variable capacitor 96 is variably controlled in a range in which an imaginary component of the combined impedance $Z_o$, i.e., a combined reactance $X_o$, has a positive value. In this case, in a range of $X_o > 0$, as the electrostatic capacitance $C_{96}$ is decreased, the combined reactance $X_o$ is decreased. Thus, a magnitude of the outer antenna current $I_{RFo}$ becomes increased relatively and a magnitude of the inner antenna current $I_{RFi}$ becomes decreased relatively. On the contrary, in a range of $X_o > 0$, as the electrostatic capacitance $C_{96}$ is increased, the combined reactance $X_o$ is increased. Thus, the magnitude of the outer antenna current $I_{RFo}$ becomes decreased relatively and the magnitude of the inner antenna current $I_{RFi}$ becomes increased relatively.

As described above, in the inductively coupled plasma etching apparatus of the present illustrative embodiment, by varying the electrostatic capacitance $C_{96}$ of the variable capacitor 96, the balance between the inner antenna current $I_{RFi}$ flowing in the inner antenna coil $54_i$ (coil segment 90) and the outer antenna current $I_{RFo}$ flowing in the outer antenna coil $54_o$ (coil segments 84(1) and 84(2)) can be adjusted as desired. As a result, it is possible to control a balance in the inductively coupled plasma densities in regions near positions directly under the inner antenna coil $54_i$ and the outer antenna coil $54_o$ as desired. Further, by varying the electrostatic capacitance $C_{58}$ of the variable capacitor 58 regardless of the balance between the antenna currents $I_{RFi}$ and $I_{RFo}$, it is possible to control a magnitude of the induced current $I_{IND}$ flowing in the floating coil 60 as desired. As a result, it is possible to control a balance of an inductively coupled plasma density in the region near the position directly under the floating coil 60 as desired. Accordingly, it is possible to variously and accurately control a plasma density in a vicinity of the susceptor 12 in the radial direction, and it is also possible to uniformize a plasma density distribution in the vicinity of the susceptor 12 in the radial direction with more accuracy.

In the present illustrative embodiment, only the inner antenna coil $54_i$ (coil segment 90) and the outer antenna coil $54_o$ (coil segments 84(1) and 84(2)) are directly connected to the matching device 66 of the high frequency power supply unit 62, and only resistance components of the antenna coils $54_i$ (90) and $54_o$ (84(1) and 84(2)) are considered as load resistances when viewed from the matching device 66. A resistance component corresponding to a power consumed in the floating coil 60 (including a power absorbed into plasma) is connected in series to the resistance components of the antenna coils $54_i$ and $54_o$ (90, 84(1) and 84(2)), and, then, added thereto. Accordingly, by using the floating coil 60, an apparent load resistance component of the RF coil 54 is increased. Therefore, it is possible to decrease a power loss of the high frequency power from the high frequency power supply unit 62, and it is also possible to increase plasma generation efficiency.

In the above-described illustrative embodiment, in order to maximize an effect (an increase in a plasma density or a decrease in a plasma density) of the floating coil 60, the floating coil 60 and the RF antenna 54 are arranged on the same plane (typically, on the dielectric window 52). However, in some cases, the effect of the floating coil 60 needs to be decreased.

By way of example, as can be seen from FIG. 5, when the induced current $I_{IND}$ flows through the floating coil 60 in the inverse direction, the current does not close to about 0, and the effect (decrease in a plasma density) of the floating coil 60 may be excessively strong. In this case, by upwardly separating the floating coil 60 from the dielectric window 52 as the ceiling plate (i.e. off a plasma region) by, for example, about 10 mm to about 20 mm, the excessively strong effect of the floating coil 60 can be weakened appropriately. Thus, when a plasma density distribution is controlled by adjusting a magnitude of the induced current $I_{IND}$ by the variable capacitor 58, a variable range of the electrostatic capacitance $C_{58}$ of the variable capacitor 58 can include a range where a flat profile is obtained.

Even when the induced current $I_{IND}$ flows through the floating coil 60 in the positive direction, if a lower limit of the electrostatic capacitance $C_{58}$ of the variable capacitor 58 in the variable range has relatively highly value, the magnitude of the induced current $I_{IND}$ cannot be controlled to be close to about 0. In this case, by upwardly separating the floating coil 60 from the dielectric window 52, the effect of the floating coil 60 can be weakened appropriately.

As described above, by changing a height position of the floating coil 60 or a distance between the floating coil and the dielectric window 52, it is possible to strengthen or weaken the effect of the floating coil 60. Therefore, in illustrative embodiments, a device for varying a height position of the floating coil 60 as desired may be provided.

[Example 1 of Configuration of Floating Coil]

Hereinafter, when a commercially available capacitor is used as the variable capacitor 58, configuration examples of the variable capacitor 58 in the floating coil 60 of the inductively coupled plasma processing apparatus of the illustrative embodiments will be explained with reference to FIGS. 11 to 15.

Figure 11:
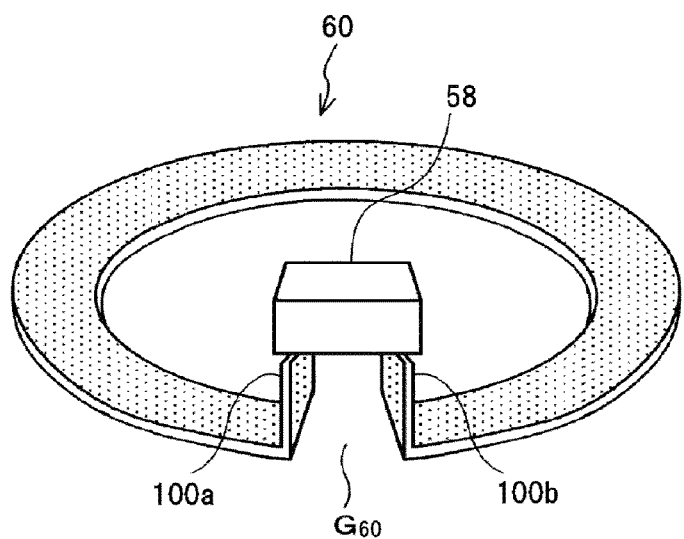
FIG. 11 is a perspective view illustrating an example of a configuration of the floating coil.

In the example illustrated in FIG. 11, the gap $G_{60}$ is formed at the floating coil 60, and a commercially available two-terminal capacitor 58 is provided at a position of the gap. In this example, capacitor connection conductors 100a and 100b that connect the coil conductor of the floating coil 60 with a terminal of a package main body of the capacitor 58 are stood uprightly from (desirably, uprightly above) the coil conductor.

As described above, when a high induced current $I_{IND}$ flows in the floating coil 60, a large-sized variable capacitor 58 that allows a high current to pass is used. However, as the size of the capacitor is increased, a size of the gap $G_{60}$ is increased. A position of the gap $G_{60}$ on the loop of the floating coil 60 becomes a non-negligible singularity of an electromagnetic field effect of the floating coil 60.

In this example, the capacitor connection conductors 100a and 100b are extended vertically upwards, and the capacitor main body is provided above the coil conductor (far away from a plasma side). Thus, the capacitor main body is difficult to see, i.e. is masked, from the plasma side.

Figure 12A:
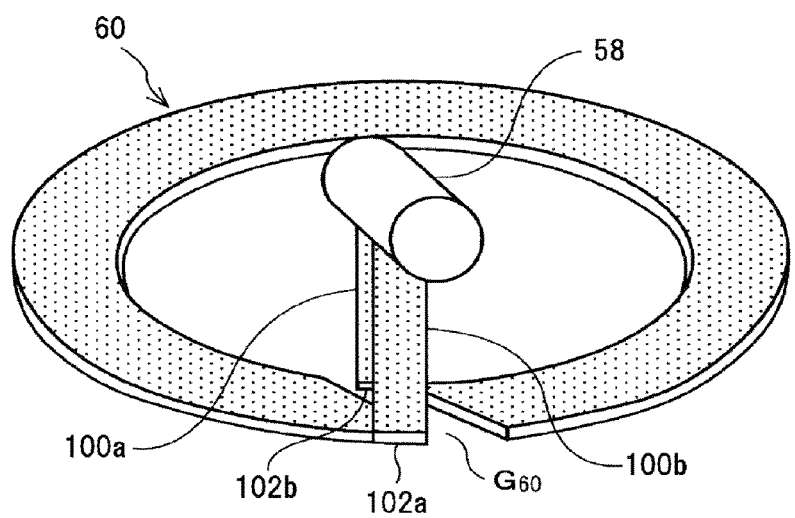
FIG. 12A is a perspective view illustrating another example of the configuration of the floating coil.
Figure 12B:
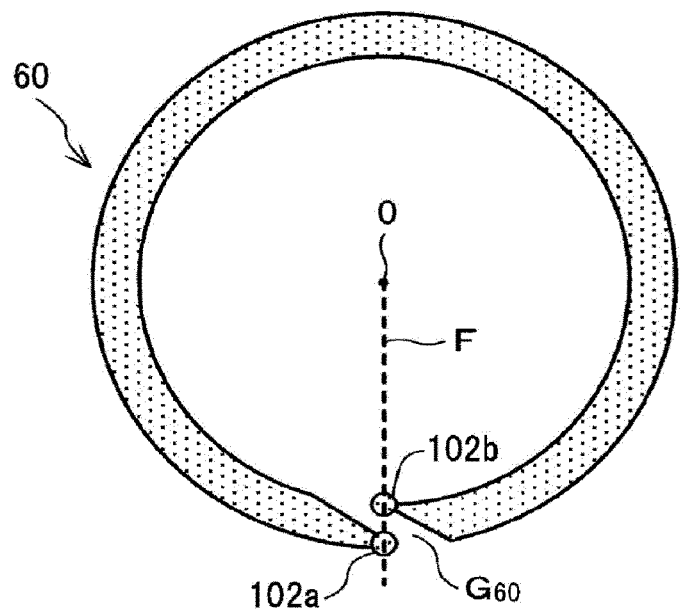
FIG. 12B is a plane view illustrating a gap in the floating coil of FIG. 12A.

In another example illustrated in FIGS. 12A and 12B, the gap $G_{60}$ of the floating coil 60 is formed obliquely so as to have a certain angle (for example, about 45°) with respect to a circumferential direction (or a radial direction) of the coil. A pair of capacitor power supply points (base ends of the capacitor connection conductors 100a and 100b) 102a and 102b are positioned at both open ends of the coil conductor so as to face each other with the gap $G_{60}$ therebetween, and the pair of capacitor power supply points 102a and 102b are aligned in a straight line F passing through a center O of the coil in the radial direction. With this configuration, since the gap $G_{60}$ is difficult to see from the plasma side, the coil conductor of the floating coil 60 appears to have a continuously ring shape in the circumferential direction when viewed from the plasma side.

Figure 12C:
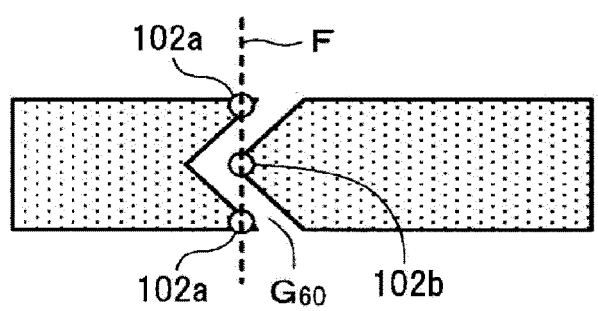
FIG. 12C is an expanded plane view illustrating a modification example of the gap of FIG. 12B.

In a modification example, as depicted in FIG. 12C, the gap $G_{60}$ of the floating coil 60 may be formed have an obliquely shape to be engaged to each other instead of being formed in an obliquely straight line.

Figure 13A:
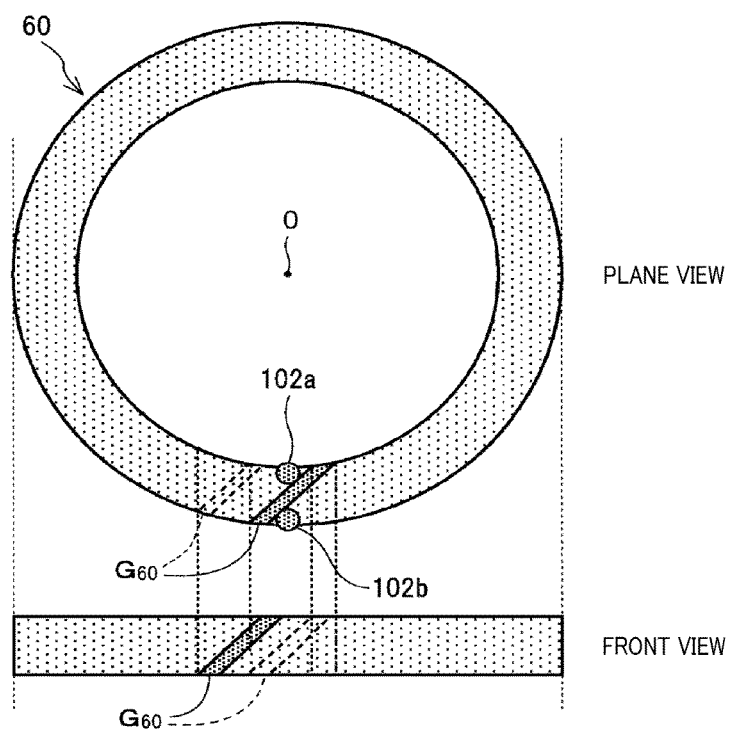
FIG. 13A illustrates still another example of the configuration of the floating coil.

In an example illustrated in FIG. 13A, the gap $G_{60}$ of the floating coil 60 is extended by cutting the coil conductor obliquely with respect to the coil radius direction as well as a vertical direction (coil axis direction). With this configuration, the gap $G_{60}$ is more difficult to see from the plasma side and the spurious continuity of the coil conductor of the floating coil 60 in the circumferential direction is increased.

Figure 13B:
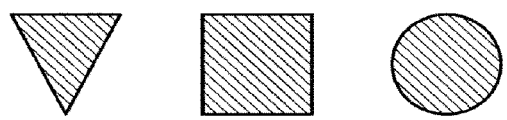
FIG. 13B is cross-sectional view of a coil conductor in the floating coil.

A cross-sectional shape of the coil conductor of the floating coil 60 is optional. By way of example, as depicted in FIG. 13B, any one of a triangle, a square, and a circle may be optionally selected.

Figure 14:
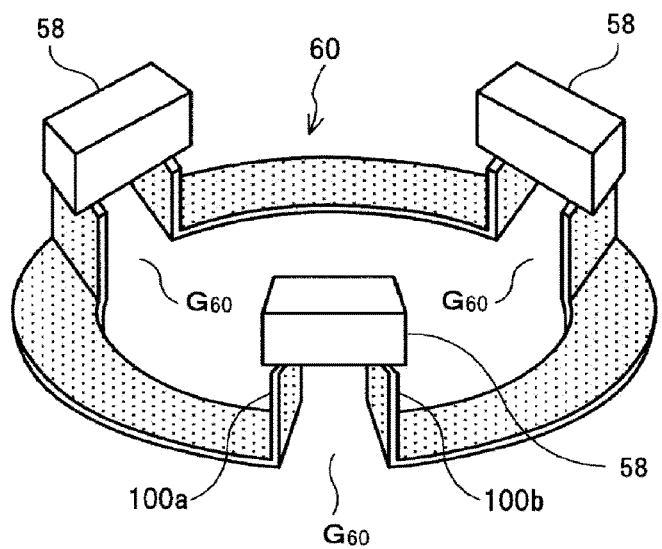
FIG. 14 is a perspective view illustrating still another example of the configuration of the floating coil.

FIG. 14 illustrates still another example useful to relieve or suppress the significant feature caused by the gap $G_{60}$ of the floating coil 60. In this example, a multiple number of, for example, three variable capacitors 58 are provided in the floating coil 60 at a regular distance from one another in the circumferential direction.

In general, an inductively coupled plasma processing apparatus is configured to generate non-uniform (donut-shaped) plasma in a region near a position directly under a RF antenna along a radial direction and diffuse the plasma so as to obtain uniform plasma above a substrate on a susceptor side. Even if a plasma density is non-uniform in the donut-shaped plasma along a circumferential direction, it can be uniformized by the diffusion. However, since a distance of the diffusion required for the uniformization is long in the circumferential direction as compared with the radial direction, it is difficult to uniformize the plasma density.

In this regard, as depicted in FIG. 14, if a plurality of discontinuous points is provided at a regular distance from one another in the circumferential direction, the distance of the diffusion required for the uniformization becomes shorter. By way of example, as depicted in FIG. 14, if three gaps $G_{60}$ are formed at a distance of about 120° from one another, the distance required for plasma diffusion in the circumferential direction is about one third of the circumference. Thus, it becomes easy to uniformize the plasma density.

Figure 15:
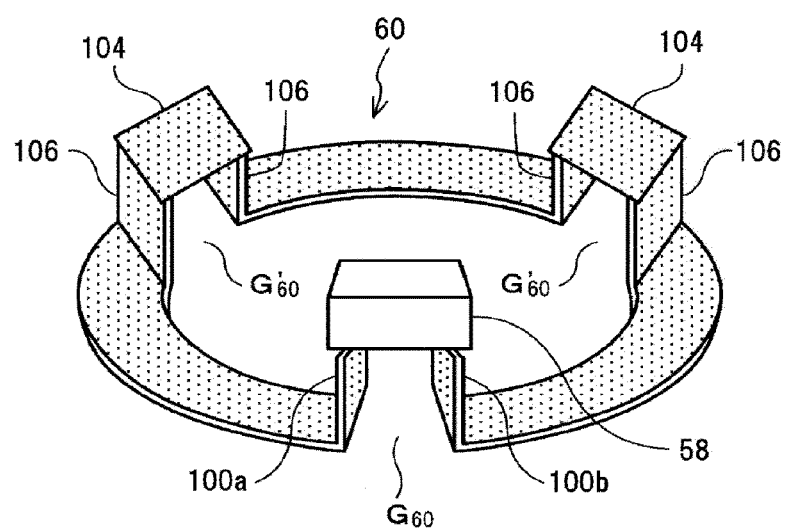
FIG. 15 is a perspective view illustrating a modification example of the floating coil of FIG. 14.

An example shown in FIG. 15 is one of modifications of the example shown in FIG. 14 and shows that dummy gaps $G_{60}'$ are formed at the floating coil 60 and dummy capacitor electrodes 104 and dummy capacitor connection conductors 106 are provided at the dummy gaps $G_{60}'$. The dummy gaps $G_{60}'$ may have exactly the same configuration as the gap $G_{60}$ for mounting the variable capacitor 58. Further, one or more dummy gaps $G_{60}'$ may be formed at certain positions to be intermixed with the gap $G_{60}$ such that all the gaps $G_{60}$ and $G_{60}'$ are formed at an equal distance from one another in the circumferential direction. The dummy capacitor electrodes 104 may be formed of a single conductive plate (for example, a copper plate). The dummy capacitor connection conductors 106 may be formed of the same material in the same shape as the authentic capacitor connection conductors 100*a* and 100*b*.

In the example shown in FIG. 14, the plurality of variable capacitors 58 are provided eclectically in series at the floating coil 60, but the example shown in FIG. 15 requires only one capacitor 58.

[Example 2 of Configuration of Floating Coil]

Hereinafter, referring to FIGS. 16 to 18, there will be explained an example in which the variable capacitor 58 as a structure is provided at the floating coil 60 as a part thereof.

Figure 16:
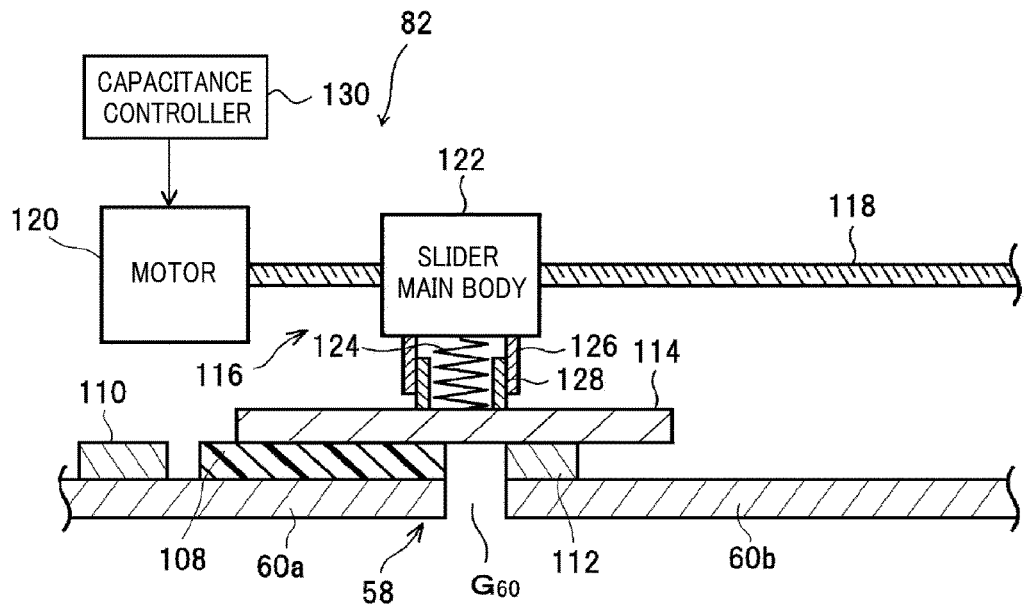
FIG. 16 is a partial cross section front view illustrating a floating coil having a variable capacitor as a part thereof.

As depicted in FIG. 16, in this example, plate-shaped or sheet-shaped dielectric member 108 and fixed contact conductor 110 having the same thickness are fixed on a coil conductor end 60*a* adjacent to the gap $G_{60}$. Herein, the fixed contact conductor 110 is positioned farther from the gap $G_{60}$ than the dielectric member 108. A plate-shaped or sheet-shaped fixed contact conductor 112 having the same thickness is fixed on the other coil conductor end 60*b* adjacent to the gap $G_{60}$ on the opposite side. A movable electrode 114 is configured to slidably move on upper surfaces of the fixed contact conductor 110, dielectric member 108, and fixed contact conductor 112 arranged in a plane so as to move along the circumferential direction. The circumferential direction of the floating coil 60 strictly forms a circular arc shape but locally forms a straight line shape in a vicinity of the gap $G_{60}$. Therefore, when the movable electrode 114 is moved in a straight line, it does not deviate from the floating coil 60 to a side.

In the capacitance varying unit 82, a slide device 116 for slidably moving the movable electrode 114 is formed of, for example, a ball screw mechanism. The slide device 116 includes a stepping motor 120 configured to rotate a transfer screw 118 extended horizontally from a certain position, a nut (not illustrated) screwed with the transfer screw 118, a slider main body 122 configured to horizontally move in an axis direction of the transfer screw 118 by rotation of the transfer screw 118, a compression coil spring 124 configured to connect the slider main body 122 with the movable electrode 114, and a pair of cylindrical bodies 126 and 128 configured to be inserted and fitted to each other so as to be slidably moved in a vertical direction. Herein, the outer cylindrical body 126 is fixed to the slider main body 122 and the inner cylindrical body 128 is fixed to the movable electrode 114. The compression coil spring 124 presses down the movable electrode 114 on the fixed contact conductor 110, dielectric member 108, and fixed contact conductor 112 by an elastic force. A capacitance controller 130 controls a slide position of the movable electrode 114 by means of a rotation direction of the stepping motor 120 and a degree of rotation thereof.

Figure 17:
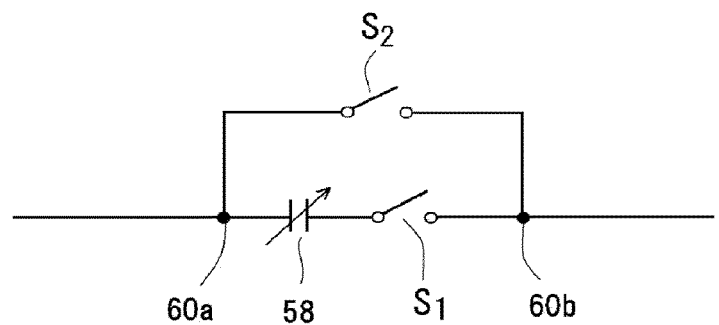
FIG. 17 is an equivalent circuit diagram illustrating a configuration in which a switch is connected to a capacitor in series and/or in parallel.

In the present example, the variable capacitor 58, a first switch $S_1$, and a second switch $S_2$ as depicted in an equivalent circuit of FIG. 17 are provided between a pair of coil conductor ends 60*e* and 60*f* with the gap $G_{60}$ interposed therebetween. Herein, the first switch $S_1$ is an opening/closing switch connected electrically in series to the variable capacitor 58 and the second switch $S_2$ is an opening/closing switch connected electrically in parallel to the variable capacitor 58.

To elaborate, the variable capacitor 58 is formed of the coil conductor end 60*a*, the dielectric member 108, the movable electrode 114, and the slide device 116. The first and second switch $S_1$ and $S_2$ are formed of the fixed contact conductors 110 and 112, the movable electrode 114, and the slide device 116.

Hereinafter, an operation of the present example will be explained with reference to FIG. 18.

Figure 18:
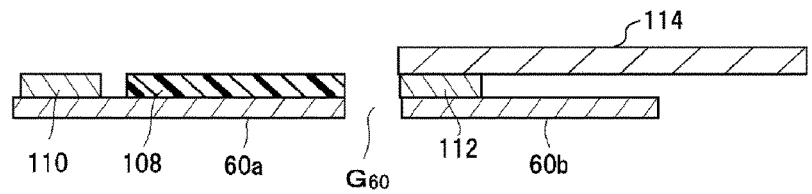
FIG. 18 is a cross-sectional view of some components for explaining an operation of the example of FIG. 16.
Figure 18:
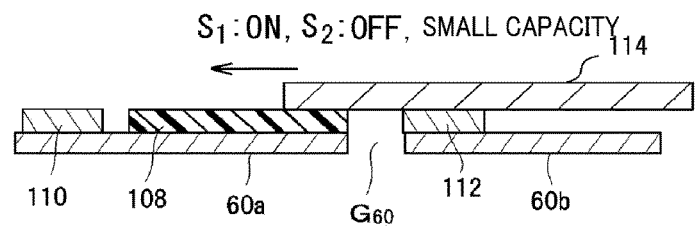
Figure 18:
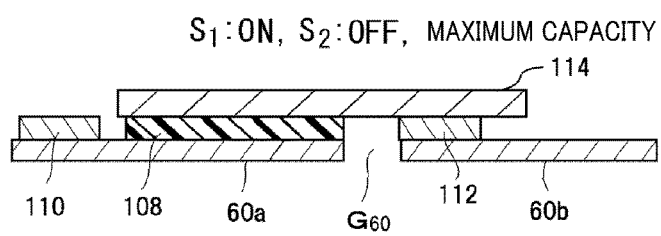
Figure 18:
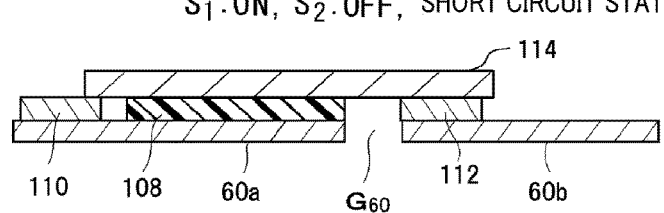

As depicted in FIG. 18(*a*), the movable electrode 114 is moved to a position where the movable electrode 114 is in contact with the fixed contact conductor 112 on the coil conductor end 60*b* and the movable electrode 114 is not in contact with the fixed contact conductor 110 and the dielectric member 108 on the other coil conductor end 60*a*. At this position, the switches $S_1$ and $S_2$ are turned off and the gap $G_{60}$ of the floating coil 60 is completely and electrically off (closed). Therefore, the induced current $I_{IND}$ does not flow through the floating coil 60, and substantially it is the same as a case where the floating coil 60 does not exist.

Then, as depicted in FIG. 18(*b*), the movable electrode 114 is moved to a position where the movable electrode 114 is in contact with the fixed contact conductor 112 on the coil conductor end 60b and the movable electrode 114 is in contact with the dielectric member 108 but not in contact with the fixed contact conductor 110 on the other coil conductor end 60a. At this position, the switch $S_2$ is open (OFF) and the switch $S_1$ is closed (ON) and the variable capacitor 58 having a significant capacitance is operated (i.e. powered on).

An electrostatic capacitance of the variable capacitor 58 becomes increased as the movable electrode 114 is moved toward the fixed contact conductor 112. As depicted in FIG. 18(c), the electrostatic capacitance of the variable capacitor 58 becomes maximized when the movable electrode 114 is moved to a position where the movable electrode 114 covers the entire upper surface of the dielectric member 108.

Thereafter, when the movable electrode 114 is further moved to the top of the fixed contact conductor 110 as depicted in FIG. 18(d), the fixed contact conductors 110 and 112 are short-circuited via the movable electrode 114 and the switch $S_1$ is closed (ON). That is, the gap $G_{60}$ is in a short-circuit state and the floating coil 60 becomes a ring with the both ends of the coil conductor closed.

As depicted in FIG. 17, the configuration in which the switches $S_1$ and $S_2$ are connected in series and/or in parallel to the variable capacitor 58 can be applied to the example (FIGS. 11 to 15) using the commercially available capacitor. Further, the switch $S_1$ connected in series to the variable capacitor 58 may be provided at a different gap from a gap where the variable capacitor 58 is provided within the loop of the floating coil 60.

[Other Examples or Modification Examples of Layout of RF Antenna and Floating Coil]

FIGS. 19 to 29 illustrate other examples or modification examples of a layout of the RF antenna 54 and the floating coil 60.

Figure 19:
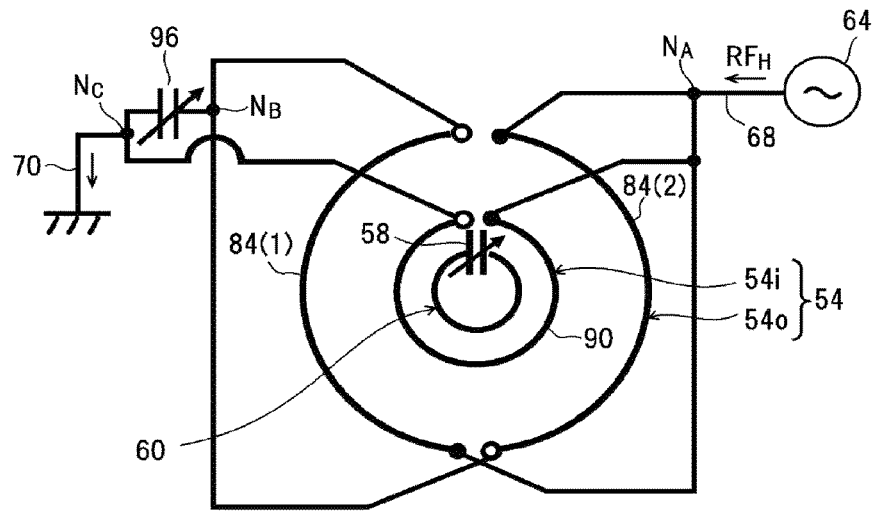
FIG. 19 illustrates an example of a layout of a RF antenna and a floating coil.
Figure 20:
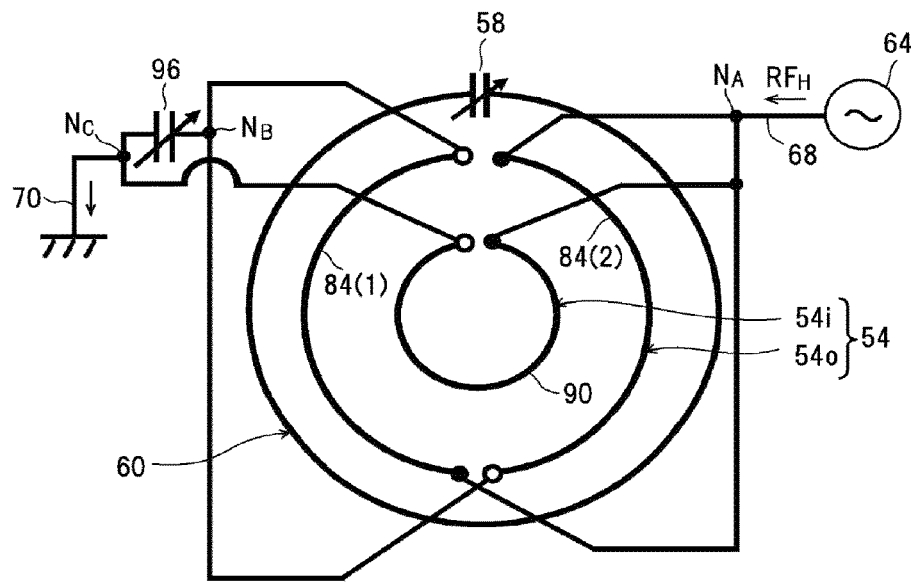
FIG. 20 illustrates another example of the layout of the RF antenna and the floating coil.

In the second illustrative embodiment, the floating coil 60 is positioned (desirably, in the middle) between the inner antenna coil $54_i$ and the outer antenna coil $54_o$ in the radial direction. As another illustrative embodiment, the floating coil 60 may be positioned inside the inner antenna coil $54_i$ in the radial direction, as depicted in FIG. 19. Otherwise, as another illustrative embodiment, the floating coil 60 may be positioned outside the outer antenna coil $54_o$ in the radial direction, as depicted in FIG. 20.

Figure 21:
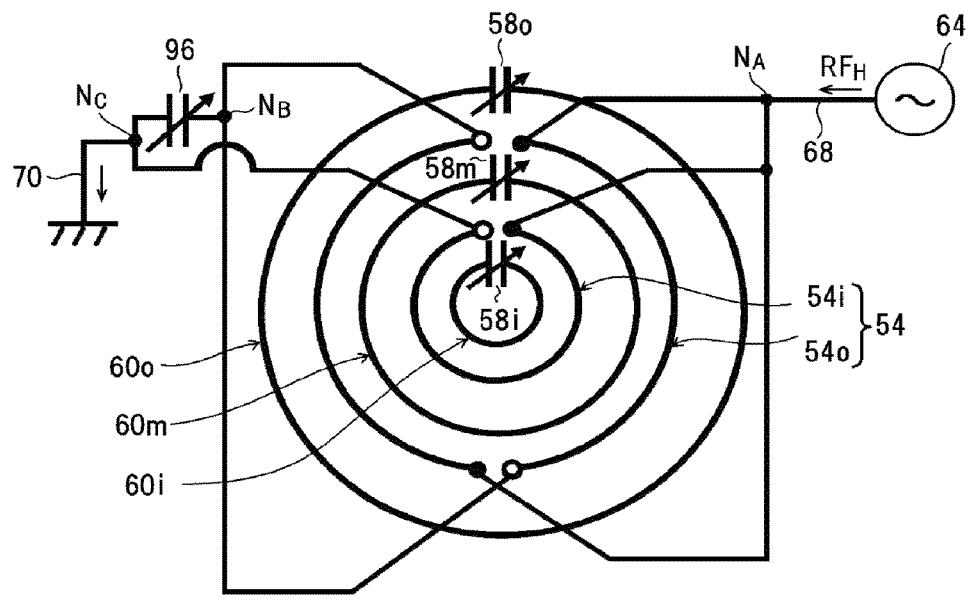
FIG. 21 illustrates still another example of the layout of the RF antenna and the floating coil.
Figure 22:
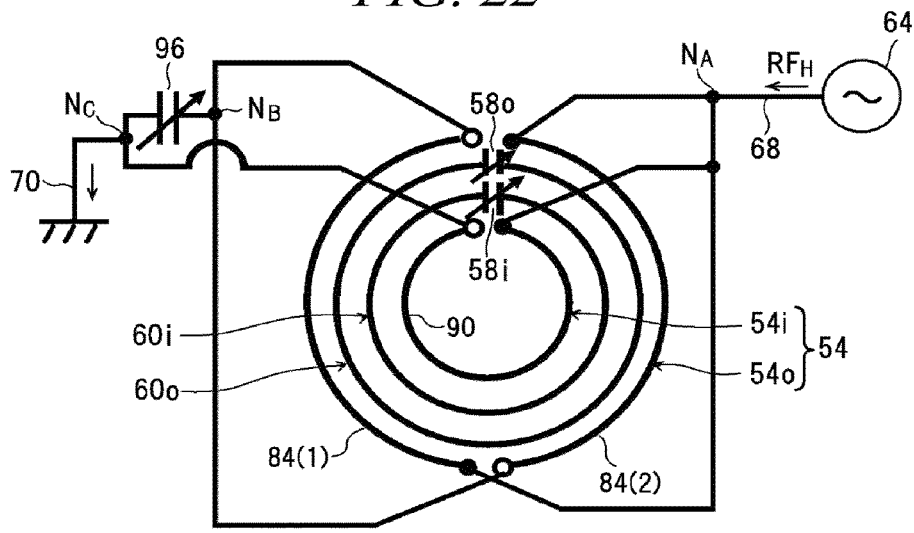
FIG. 22 illustrates still another example of the layout of the RF antenna and the floating coil.

Further, a multiple number of floating coils each having a different diameter may be coaxially provided. By way of example, as depicted in FIG. 21, a floating coil $60_i$ having a small diameter is positioned inside the inner antenna coil $54_i$ in the radial direction, a floating coil $60_m$ having a medium diameter is positioned between the inner antenna coil $54_i$ and the outer antenna coil $54_o$, and a floating coil $60_o$ having a large diameter is positioned outside the outer antenna coil $54_o$ in the radial direction. In this case, variable capacitors $58_i$, $58_m$, and $58_o$ are provided within loops of the floating coils $60_i$, $60_m$, and $60_o$, respectively. Otherwise, as depicted in FIG. 22, a multiple number of (for example, two) floating coils $60_i$ and $60_o$ each having a different diameter may be provided between the two (inner and outer) antenna coils $54_i$ and $54_o$.

Figure 23:
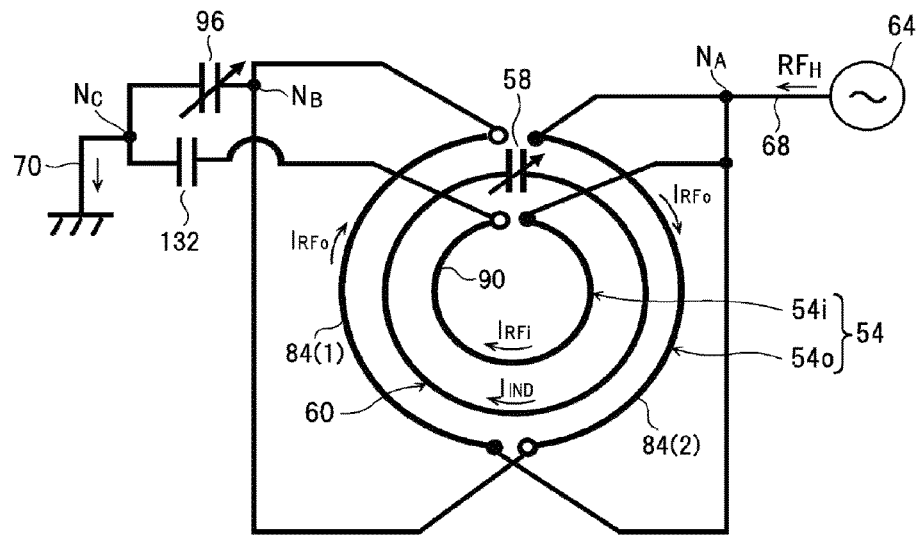
FIG. 23 illustrates still another example of the layout of the RF antenna and the floating coil.
Figure 24:
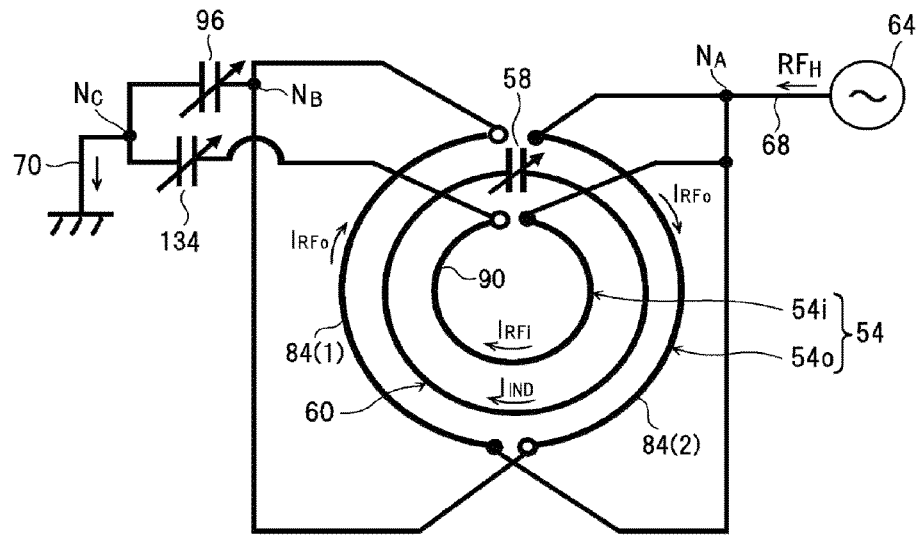
FIG. 24 illustrates still another example of the layout of the RF antenna and the floating coil.

As depicted in FIG. 23, as impedance control units provided in the RF antenna 54, the variable capacitor 96 connected in series to the outer antenna coil $54_o$ and a fixed capacitor 132 connected in series to the inner antenna coil $54_i$ are provided between the node $N_A$ on the high frequency input side and the node $N_C$ on the high frequency output side. With this configuration, a variable range of a balance between the inner antenna current $I_{RFi}$ and the outer antenna current $I_{RFo}$ can be increased. As depicted in FIG. 24, instead of the fixed capacitor 132, a variable capacitor 134 may be used.

Figure 25:
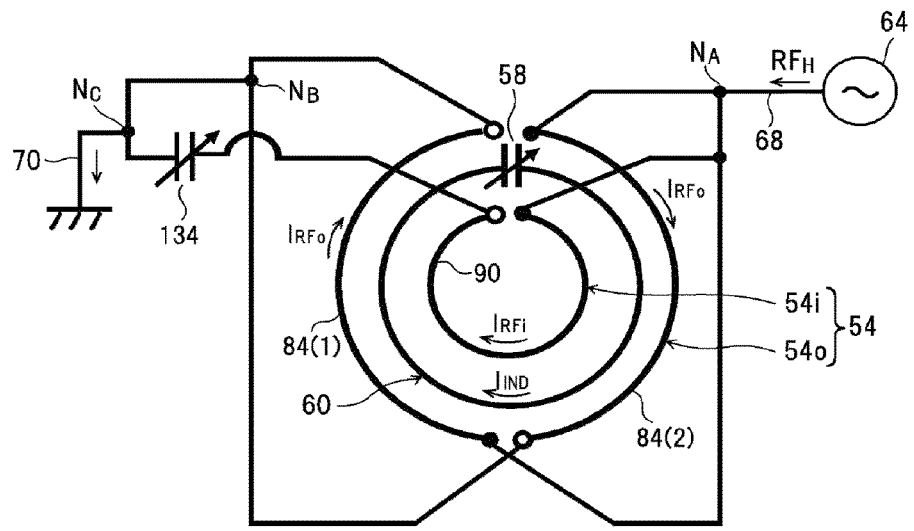
FIG. 25 illustrates still another example of the layout of the RF antenna and the floating coil.
Figure 26:
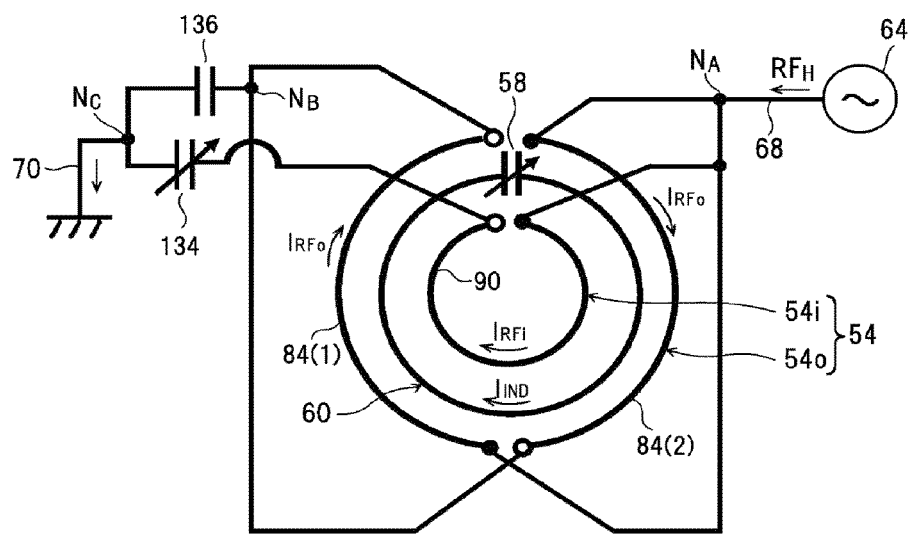
FIG. 26 illustrates still another example of the layout of the RF antenna and the floating coil.

Otherwise, as depicted in FIG. 25, the variable capacitor 134 connected in series to the inner antenna coil $54_i$ may be provided between the node $N_A$ and the node $N_C$, but an impedance control unit connected in series to the outer antenna coil $54_o$ may not be provided therebetween. In order to increase the variable range of the balance between the inner antenna current $I_{RFi}$ and the outer antenna current $I_{RFo}$ respectively flowing in the inner and outer antenna coils $54_i$ and $54_o$, the variable capacitor 134 connected in series to the inner antenna coil $54_i$ and a fixed capacitor 136 connected in series to the outer antenna coil $54_o$ may be provided between the node $N_A$ and the node $N_C$, as depicted in FIG. 26.

Figure 27:
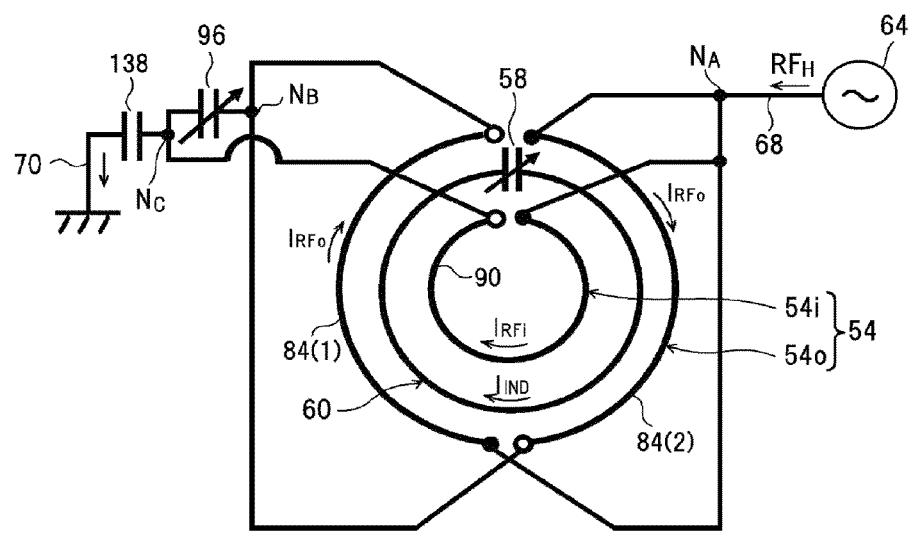
FIG. 27 illustrates still another example of the layout of the RF antenna and the floating coil.

As depicted in FIG. 27, an output side common impedance control unit (for example, capacitor) 138 electrically connected in series to all the coil segments 90, 84(1), and 84(2) within the RF antenna 54 may be provided on an end of the RF antenna 54, i.e., between the second node $N_B$ and the earth line 70 (or on the earth line 70). Although the output side (end) common impedance control unit 138 may be typically a fixed capacitor, it may also be a variable capacitor.

The output side (end) common impedance control unit 138 has a function of adjusting the entire impedance of the RF antenna 54. Further, when a capacitor is used as the output side (end) common impedance control unit 138, the output side (end) common impedance control unit 138 also has a function of suppressing ion sputtering on the ceiling plate or the dielectric window 52 by increasing the entire electric potential (DC) of the RF antenna 54 from a ground potential. The common impedance control unit 138 may be applied to the other illustrative embodiments or modification examples (FIGS. 19 to 26).

Figure 28:
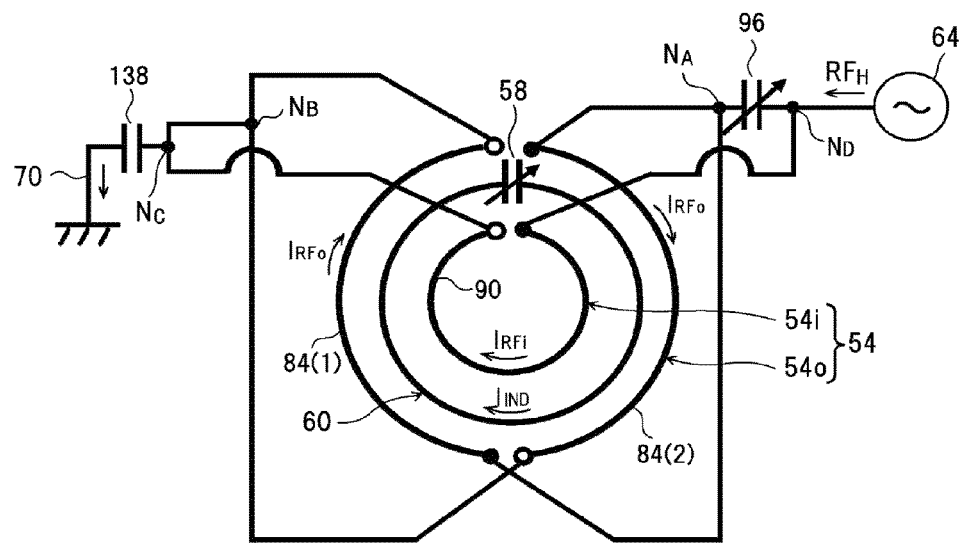
FIG. 28 illustrates still another example of the layout of the RF antenna and the floating coil.

As depicted in FIG. 28, an impedance control unit (variable capacitor 96) for controlling the balance between the inner antenna current $I_{RFi}$ and the outer antenna current $I_{RFo}$ respectively flowing in the inner and outer antenna coils $54_i$ and $54_o$ may be provided between the node $N_A$ and a node $N_D$ on the high frequency input side. Herein, the node $N_A$ is between the inner antenna coil $54_i$ and the outer antenna coil $54_o$, and the node $N_D$ is between the coil segments 84(1) and 84(2).

Figure 29:
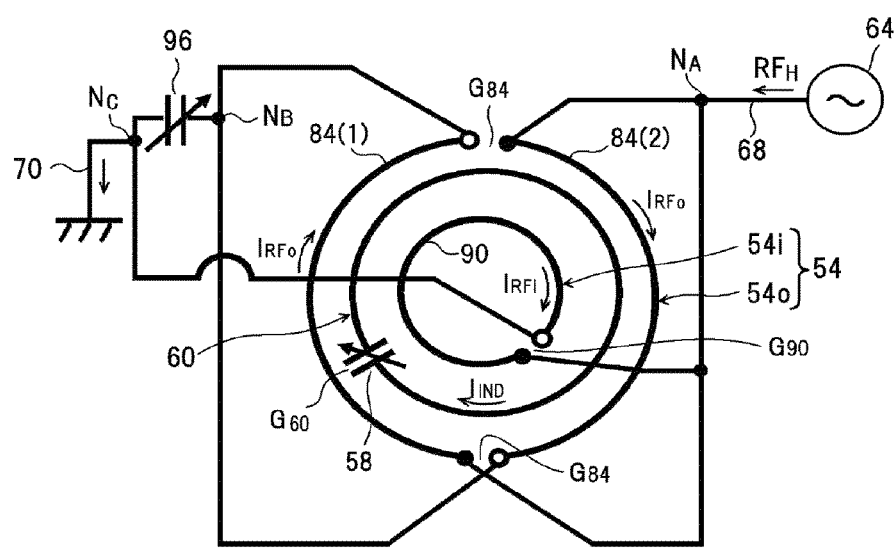
FIG. 29 illustrates still another example of the layout of the RF antenna and the floating coil.

As depicted in FIG. 29, in order to prevent non-uniform of the plasma density distribution in the circumferential direction, the gap $G_{90}$ in the inner antenna coil $54_i$, the gap $G_{84}$ in the outer antenna coil $54_o$, and the gap $G_{60}$ in the floating coil 60 may be positioned so as to be deviated to each other in the circumferential direction.

[Examples of Triple Antenna Coil]

Figure 30:
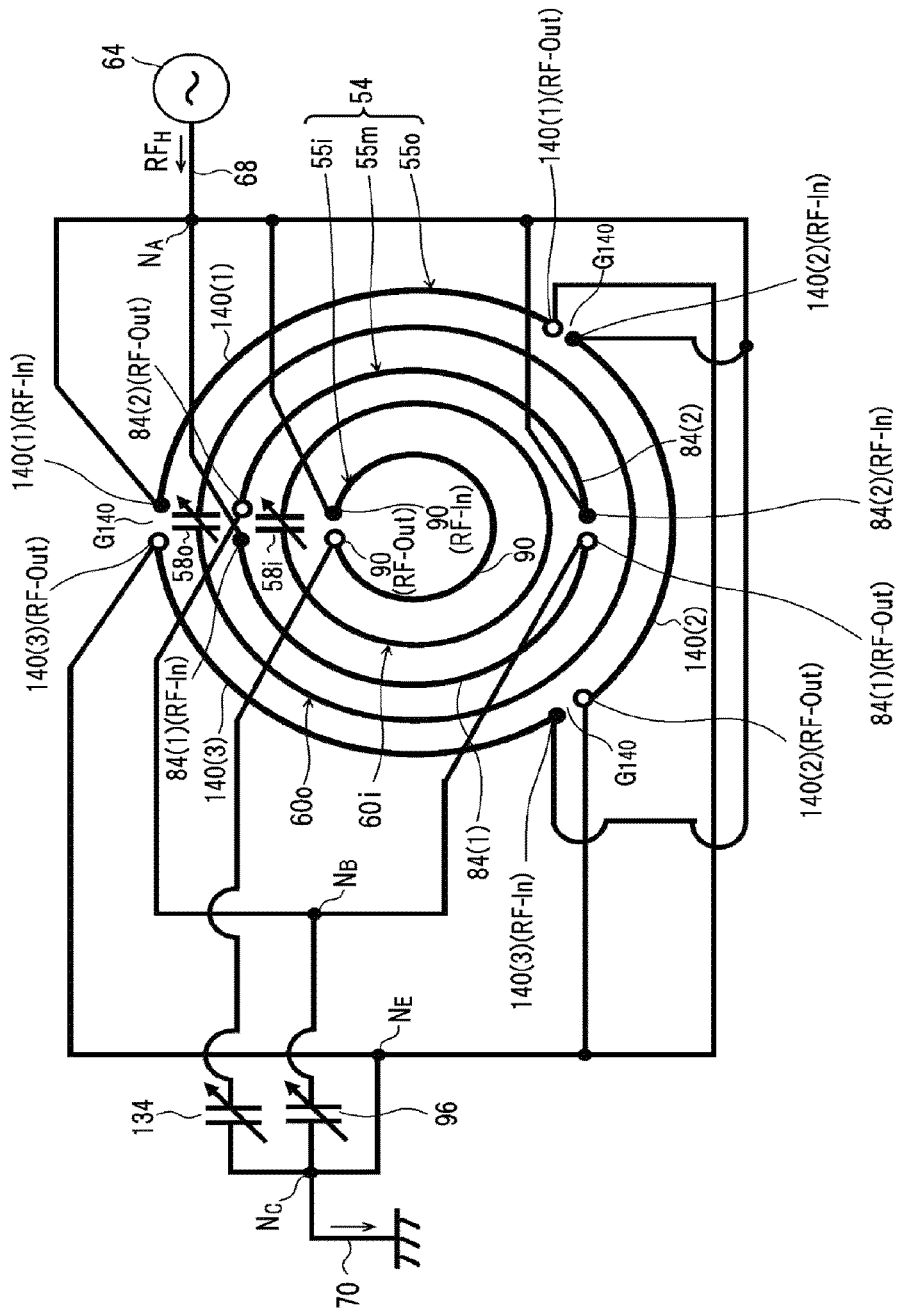
FIG. 30 illustrates an example of a triple antenna coil.
Figure 31:
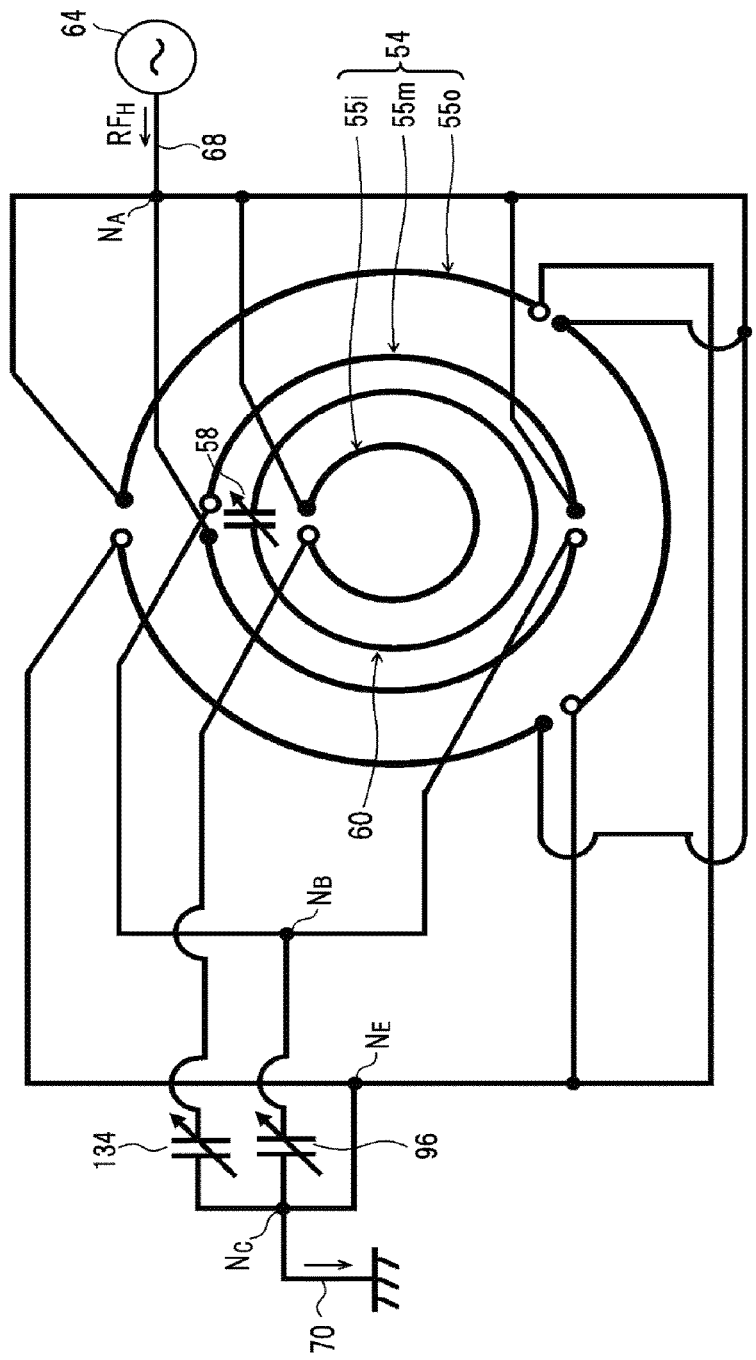
FIG. 31 illustrates another example of the triple antenna coil.

FIG. 30 illustrates an example of the RF antenna 54 including triple antenna coils $55_i$, $55_m$, and $55_o$ each having a different diameter. In this RF antenna 54, the inner antenna coil $55_i$ having the smallest diameter and the intermediate antenna coil $55_m$ having a medium diameter have the same configurations as the inner antenna coil $54_i$ and the outer antenna coil $54_o$ described in the second illustrative embodiment. In the present example, the outer antenna coil $55_o$ having the largest diameter includes three outer coil segments 140(1), 140(2), and 140(3) divided in a circumferential direction. This triple antenna coils $55_i$, $55_m$, and $55_o$ have, desirably, a loop shape (for example, a circular ring shape in the drawing) similar to one another and are provided coaxially(concentrically) on the same plane (on the dielectric window 52).

By way of example, if the semiconductor wafer W as a processing target substrate has a diameter of about 300 mm, the inner antenna coil $55_i$, the intermediate antenna coil $55_m$, and the outer antenna coil $55_o$ have diameters of about 100 mm, about 300 mm, and about 500 mm, respectively.

Spatially, each of three outer coil segments 140(1), 140(2), and 140(3) of the outer antenna coil $55_o$ is formed in about ⅓ circular arc shape. These three outer coil segments 140(1), 140(2), and 140(3) are arranged in series to be extended along one round in the circumferential direction or along the most of one round in the circumferential direction. To elaborate, in an one-round loop of an outer antenna coil $55_o$, a RF input terminal 140(1)(RF-In) of the first outer coil segment 140(1) and a RF output terminal 140(3)(RF-Out) of the third outer coil segment 140(3) are positioned adjacently or face to each other with an outer gap $G_{140}$ therebetween in the circumferential direction. Further, a RF output terminal 140(1)(RF-Out) of the first outer coil segment 140(1) and a RF input terminal 140(2)(RF-In) of the second outer coil segment 140(2) are positioned adjacently or face to each other with another outer gap $G_{140}$ therebetween in the circumferential direction. Furthermore, a RF output terminal 140(2)(RF-Out) of the second outer coil segment 140(2) and a RF input terminal 140(3)(RF-In) of the third outer coil segment 140(3) are positioned adjacently or face to each other with the other outer gap $G_{140}$ therebetween in the circumferential direction.

In this way, between the RF power supply line 68 of the high frequency power supply unit 62 and the earth line 70 or between the node $N_A$ on the high frequency input side and the node $N_C$ on the high frequency output side, the two intermediate coil segments 84(1) and 84(2) of the intermediate antenna coil $55_m$ are electrically connected to each other in parallel; the three outer coil segments 140(1), 140(2), and 140(3) of the outer antenna coil $55_o$ are electrically connected to one another in parallel; and the single inner coil segment 90 of the inner antenna coil $55_i$ is electrically connected in parallel to the intermediate coil segments 84(1) and 84(2) and the outer coil segments 140(1), 140(2), and 140(3). Further, the respective components of the RF antenna 54 are connected such that directions of intermediate antenna currents $I_{RFm}$ flowing in the intermediate coil segments 84(1) and 84(2) are all same in the circumferential direction, and directions of outer antenna currents $I_{RFo}$ flowing in the outer coil segments 140(1), 140(2), and 140(3) are also all same in the circumferential direction.

In the present example, desirably, the two intermediate coil segments 84(1) and 84(2) of the intermediate antenna coil $55_m$ have substantially the same self-inductance, and the three outer coil segments 140(1), 140(2), and 140(3) of the outer antenna coil $55_o$ have substantially the same self-inductance. Thus, a regular or uniform intermediate antenna current $I_{RFm}$ flows in an one-round loop of the intermediate antenna coil $55_m$, i.e. in the intermediate coil segments 84(1) and 84(2), and a regular or uniform outer antenna current $I_{RFo}$ flows in the one-round loop of the outer antenna coil $55_o$, i.e. in the outer coil segments 140(1), 140(2), and 140(3).

In the present example, the coil connection configuration of the RF antenna 54 has an important feature. That is, when a high frequency transmission lines are continuously extended from the high frequency power supply line 68 of the high frequency power supply unit 62 to the earth line 70, a winding direction of the intermediate antenna coil $55_m$ on the high frequency power transmission line (counterclockwise direction in FIG. 30) is opposite to winding directions of the inner antenna coil 55, and the outer antenna coil $55_o$ on the high frequency power transmission lines (clockwise direction in FIG. 30) in the circumferential direction. In such a reverse-direction connection configuration, an electrostatic capacitance $C_{96}$ of the variable capacitor 96 is adjusted within a certain range so as to allow a direction of the intermediate antenna current $I_{RFm}$ flowing in the intermediate antenna coil $55_m$ to become equal to directions of the inner and outer antenna currents $I_{RFi}$ and $I_{RFo}$ respectively flowing in the inner antenna coil $55_i$ and the outer antenna coil $55_o$ in the circumferential direction.

That is, the electrostatic capacitance $C_{96}$ of the variable capacitor 96 is varied and selected in a range in which an electrostatic capacitance obtained when a series resonance occurs in a series circuit including the intermediate antenna coil $55_m$ and the variable capacitor 96 is small. Thus, the intermediate antenna current $I_{RFm}$ flowing in the intermediate antenna coil $55_m$ flows in the same direction as the inner antenna current $I_{RFi}$ and the outer antenna current $I_{RFo}$ respectively flowing in the inner antenna coil $55_i$ and the outer antenna coil $55_o$ in the circumferential direction. Further, a magnitude of the intermediate antenna current $I_{RFm}$ may be gradually increased from about zero and may be set to be, for example, about 1/10 or less of the inner and outer antenna currents $I_{RFi}$ and $I_{RFo}$.

Further, it is verified by an experiment that if the intermediate antenna current $I_{RFm}$ is set to be sufficiently smaller than (for example, about 1/10 or less) of the inner and outer antenna currents $I_{RFi}$ and $I_{RFo}$, the plasma density within the donut-shaped plasma in the chamber 10 can be uniformized effectively.

Even when the intermediate antenna coil $55_m$ is not provided, plasma generated in the regions near the positions directly under the inner antenna coil $55_i$ and the outer antenna coil $55_o$ is diffused in the radial direction. Thus, plasma having a considerably high density exists in a region between the two coils $55_i$ and $55_o$. Accordingly, if the small amount of the current $I_{RFm}$ flows independently through the intermediate antenna coil $55_m$ between the two coils $55_i$ and $55_o$ in the same circumferential direction as those of the currents $I_{RFi}$ and $I_{RFo}$ flowing in the two coils $55_i$ and $55_o$, respectively, inductively coupled plasma is generated to be appropriately increased in the region near the position directly under the intermediate antenna coil $55_m$. As a result, plasma density can be uniform in the radial direction.

In the present example, in order to set the intermediate antenna current $I_{RFm}$ flowing in the intermediate antenna coil $55_m$ to be of a sufficiently small value, the intermediate antenna coil $55_m$ is connected in the opposite direction against those of the inner antenna coil $55_i$ and the outer antenna coil $55_o$, and the electrostatic capacitance $C_{96}$ of the variable capacitor 96 is varied within the range in which the intermediate combined reactance $X_m$ has a negative value. In such a case, as the value of the $C_{96}$ is decreased within the range of $X_m<0$, an absolute value of the intermediate combined reactance $X_m$ would be increased. As a result, the intermediate antenna current $I_{RFm}$ is decreased (close to zero). Meanwhile, as the value of the $C_{96}$ is increased within the range of $X_m<0$, the absolute value of the intermediate combined reactance $X_m$ would be decreased. As a result, the intermediate antenna current $I_{RFm}$ is increased.

Alternatively, it may be also possible to vary the electrostatic capacitance $C_{96}$ of the variable capacitor 96 within a range in which the intermediate combined reactance $X_m$ has a positive value. In this case, the intermediate antenna current $I_{RFm}$ in the intermediate antenna coil $55_m$ would flow in the opposite direction against those of the inner antenna current $I_{RFi}$ and the outer antenna current $I_{RFo}$ in the inner antenna coil $55_i$ and the outer antenna coil $55_o$, respectively. This configuration may be applicable when plasma density needs to be reduced in the region near the position directly under the intermediate antenna coil $55_m$ intentionally.

In the present example, the inner floating coil $60_i$ having a relatively small diameter is positioned (desirably, in the middle) between the inner antenna coil $55_i$ and the intermediate antenna coil $55_m$ and the outer floating coil $60_o$ having a relatively large diameter is positioned (desirably, in the middle) between the intermediate antenna coil $55_m$ and the outer antenna coil $55_o$. These inner and outer floating coils $60_i$ and $60_o$ may have, desirably, a loop shape (for example, a circular ring shape in the drawing) similar to the antenna coils $55_i$, $55_m$, and $55_o$. Further, the inner and outer floating coils $60_i$ and $60_o$ may be provided coaxially/concentrically. As described above, when the inner antenna coil $55_i$, the intermediate antenna coil $55_m$, and the outer antenna coil $55_o$ have diameters of about 100 mm, about 300 mm, and about 500 mm, respectively, the inner and outer floating coils $60_i$ and $60_o$ have diameters of about 200 mm and about 400 mm, respectively.

The variable capacitors $58_i$ and $58_o$ are provided within the loops of the floating coils $60_i$ and $60_o$, respectively. By respectively controlling electrostatic capacitances $C_{58i}$ and $C_{58o}$ of the variable capacitors $58_i$ and $58_o$, it is possible to control magnitudes of induced currents $I_{INDi}$ and $I_{INDo}$ respectively flowing in the floating coils $60_i$ and $60_o$ to be appropriate (typically, small). Thus, plasma density in the region near the position directly under each of the floating coils $60_i$ and $60_o$ can be finely controlled. In this way, it is possible to accurately control plasma density distribution in the radial direction.

In the inner floating coil $60_i$, an induced electromotive force is generated by a change of a magnetic field in the inner and intermediate antenna coils $55_i$ and $55_m$. Therefore, the induced current $I_{INDi}$ flowing in the loop of the inner floating coil $60_i$ largely depends on the inner and intermediate antenna currents $I_{RFi}$ and $I_{RFm}$. Likewise, the induced current $I_{INDo}$ flowing in the loop of the outer floating coil $60_o$ largely depends on the intermediate and outer antenna currents $I_{RFm}$ and $I_{RFo}$. Dependency or interrelation between the floating coil and both the adjacent antenna coils is not inappropriate but desirable in consideration of an effect of the floating coil on a decrease of a plasma density in the region between the both adjacent antenna coils.

FIGS. 31 to 34 illustrate modification examples of this example. In a configuration example depicted in FIG. 31, the outer floating coil $60_o$ is omitted from the above-described example (FIG. 30), and a single floating coil 60 is provided between the inner antenna coil $55_i$ and intermediate antenna coil $55_m$. Although not illustrated, the single floating coil 60 may be provided between intermediate antenna coil $55_m$ and the outer antenna coil $55_o$.

Figure 32:
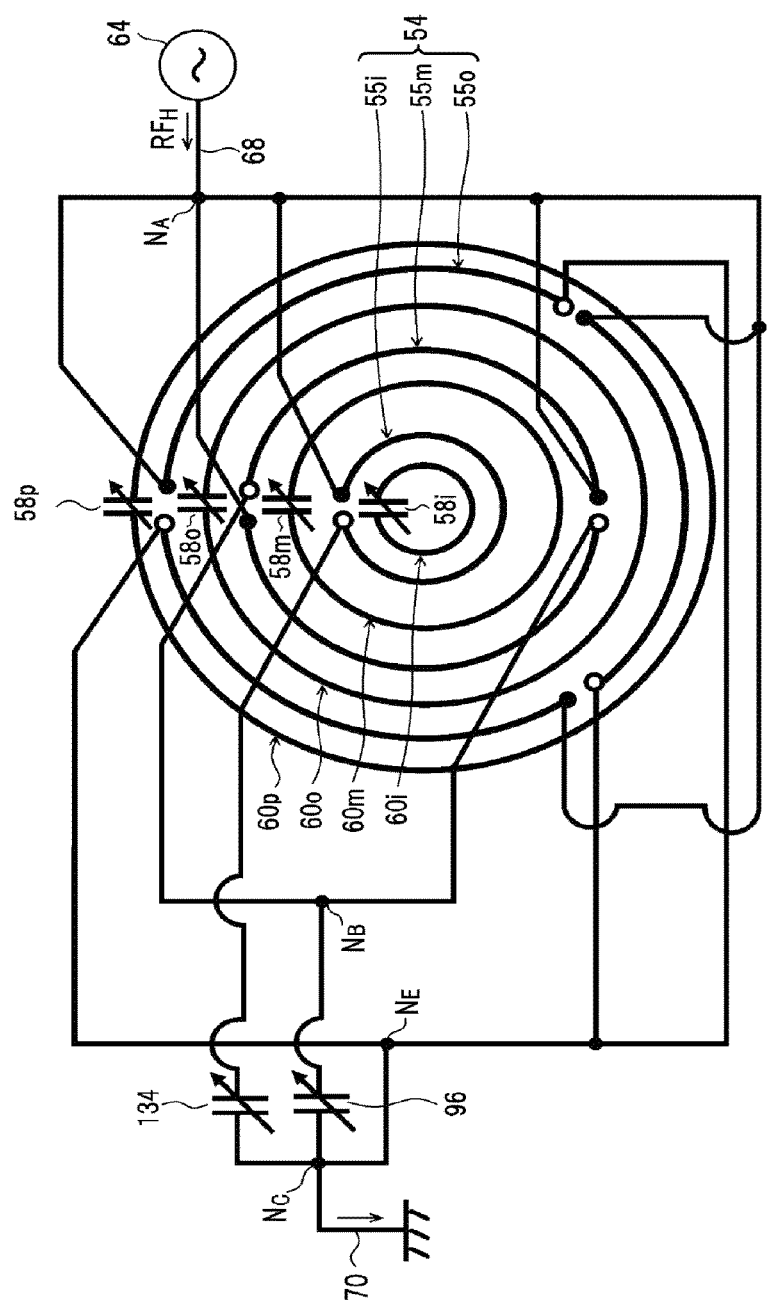
FIG. 32 illustrates still another example of the triple antenna coil.
Figure 33:
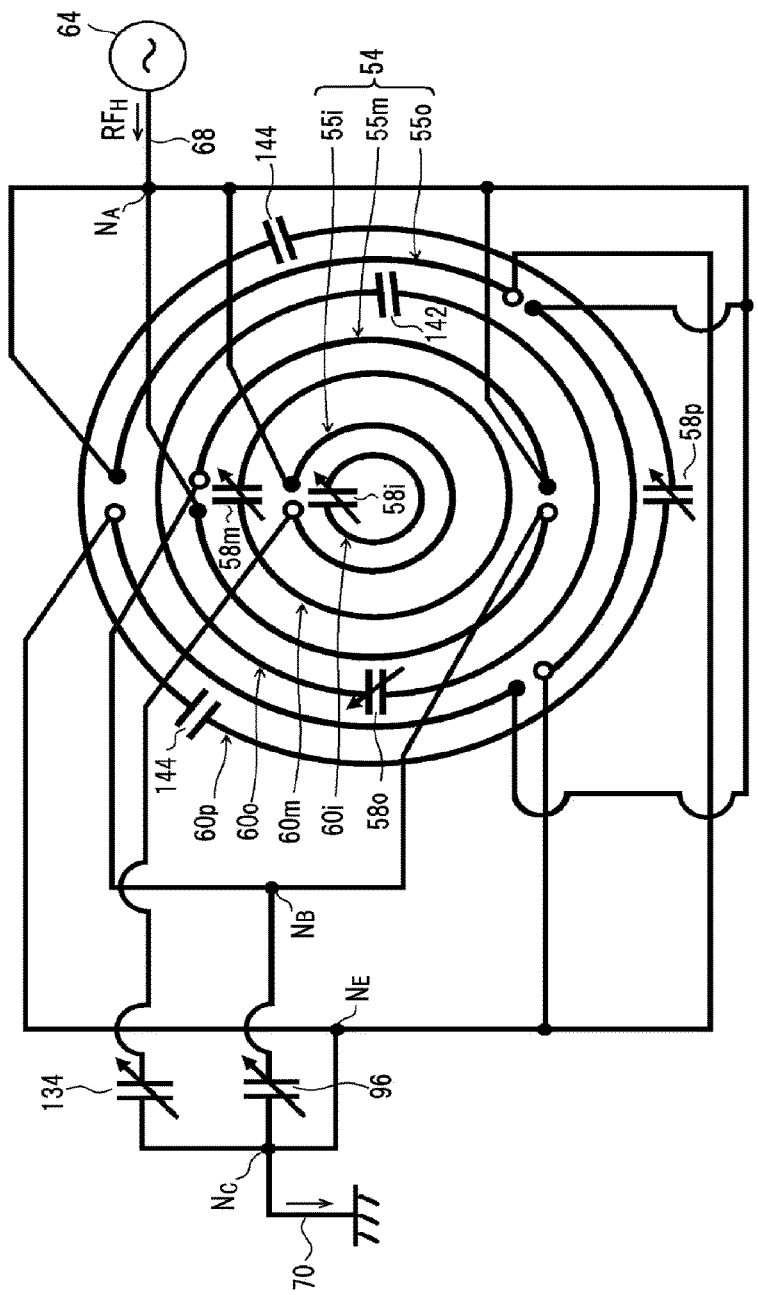
FIG. 33 illustrates still another example of the triple antenna coil.

In a configuration example depicted in FIG. 32, a fourth (outermost peripheral) floating coil $60_p$ is provided outside the outer antenna coil $55_o$ in addition to the above-described example (FIG. 30). In a configuration example depicted in FIG. 33, fixed capacitors 142 and 144 as well as variable capacitors $58_o$ and $58_p$ are provide within loops of the outer floating coil $60_o$ and the outermost peripheral floating coil $60_p$ each having a large diameter in addition to the configuration example (FIG. 31) depicted in FIG. 32.

Figure 34:
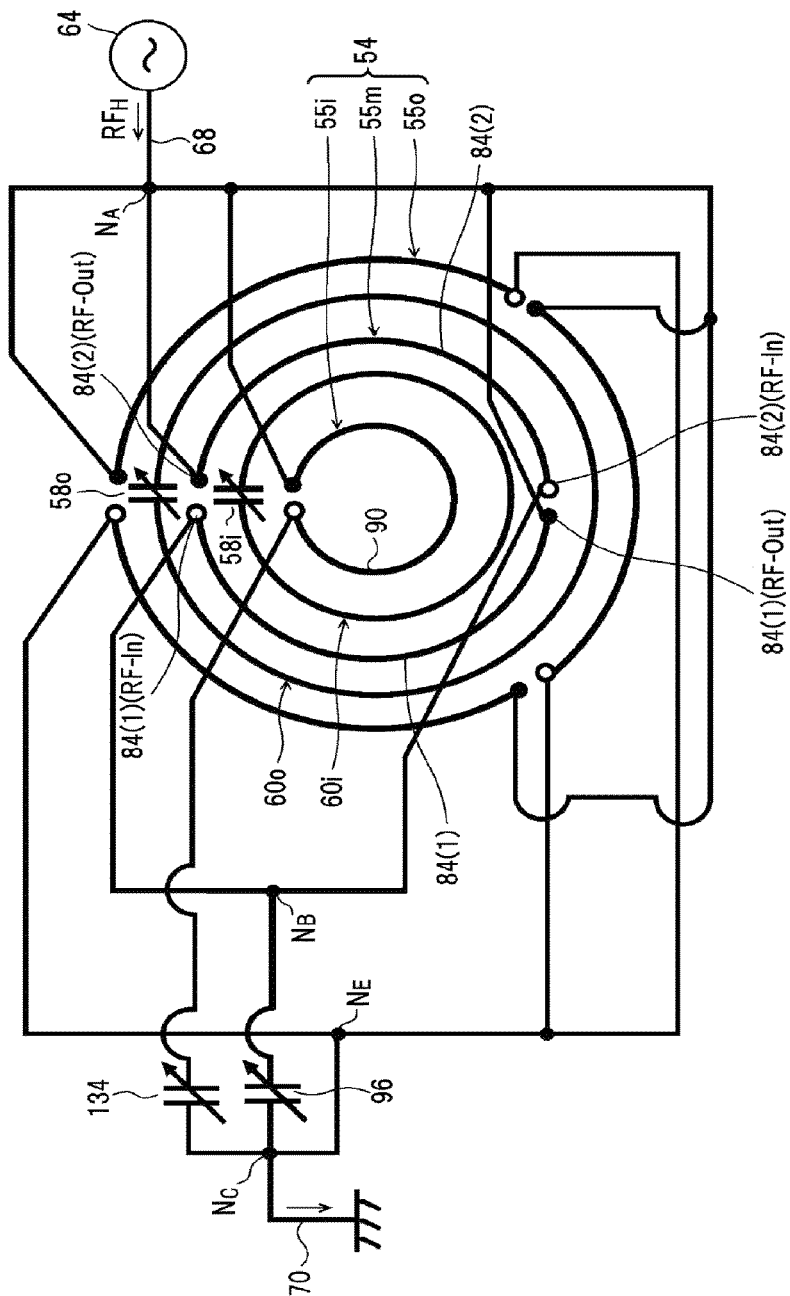
FIG. 34 illustrates still another example of the triple antenna coil.

In a configuration example shown in FIG. 34, in the RF antenna 54, the intermediate antenna coil $55_m$ is connected in the same direction (forward direction) as those of the inner antenna coil $55_i$ and the outer antenna coil $55_o$. That is, when a high frequency transmission lines are continuously extended from the node $N_A$ on the high frequency input side to the node $N_C$ on the high frequency output side, a winding direction of the intermediate antenna coil $55_m$ on the high frequency power transmission line is equal to winding directions of the inner antenna coil $55_i$ and the outer antenna coil $55_o$ on the high frequency power transmission lines (clockwise directions in FIG. 34) in the circumferential direction.

In such a case, when the electrostatic capacitance $C_{96}$ of the variable capacitor 96 is varied within a range in which the intermediate combined reactance $X_m$ has a positive value, the intermediate antenna current $I_{RFm}$ can be varied in the same direction as those of the inner antenna current $I_{RFi}$ and the outer antenna current $I_{RFo}$ in the circumferential direction. That is, as the value of the $C_{96}$ is decreased within the range of $X_m>0$, a value of the intermediate combined reactance $X_m$ would be decreased. As a result, the intermediate antenna current $I_{RFm}$ is increased. Meanwhile, as the value of the $C_{96}$ is increased within the range of $X_m>0$, the value of the intermediate combined reactance $X_m$ would be increased. As a result, the intermediate antenna current $I_{RFm}$ is decreased. However, even if the $C_{96}$ is increased indefinitely, the intermediate combined reactance $X_m$ may not fall below an inductive reactance of the intermediate antenna coil $55_m$. Thus, the value of the intermediate antenna current $I_{RFm}$ cannot be minimized (close to zero). For this reason, by a typical method, it may be difficult to control the intermediate antenna current $I_{RFm}$ to be equal to or less than about 1/10 of the inner antenna current $I_{RFi}$ and the outer antenna current $I_{RFo}$.

Meanwhile, in a configuration example shown in FIG. 34, the electrostatic capacitance $C_{96}$ of the variable capacitor 96 may be varied within a range in which the combined reactance $X_m$ has a negative value. In such a case, the flowing direction of the intermediate antenna current $I_{RFm}$ becomes opposite to the flowing directions of the inner antenna current $I_{RFi}$ and the outer antenna current $I_{RFo}$ in the circumferential direction. This configuration may be applicable when a plasma density needs to be reduced in the region near the position directly under the intermediate antenna coil $55_m$ intentionally.

In all of these cases, the inner floating coil $60_i$ and the outer floating coil $60_o$ are provided. Thus, by appropriately adjusting electrostatic capacitances $C_{58i}$, $C_{58o}$, $C_{96}$, and $C_{134}$ of the variable capacitors $58_i$, $58_o$, 96, and 134, respectively, it is possible to control a plasma density distribution in the radial direction as desired, as a whole.

Although not illustrated, the impedance control variable capacitors 96, 132, 134, and 136 may be connected and used in the example of the triple antenna coil in the same manner as the example (FIGS. 19 to 29) of the dual antenna coil.

[Example of Floating Coil Including Fixed Capacitor]

Figure 35:
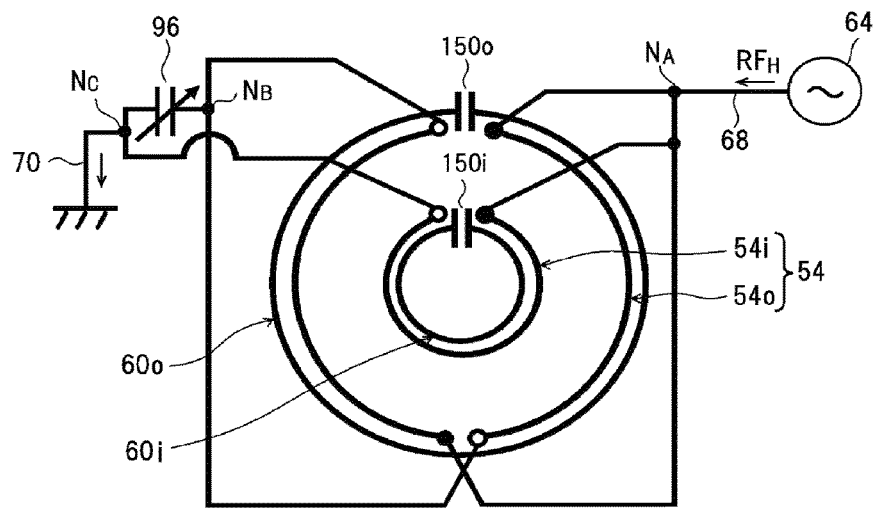
FIG. 35 illustrates an example where a fixed capacitor is provided in a loop of a floating coil.

FIG. 35 illustrates an example in which fixed capacitors $150_i$ and $150_o$ are provided within the loops of the inner floating coil $60_i$ and the outer floating coil $60_o$, respectively. The inner floating coil $60_i$ and the outer floating coil $60_o$ in this example are, desirably, circular ring-shaped single-wound coils. The inner floating coil $60_i$ and the outer floating coil $60_o$ are respectively provided to be close as much as possible to the inner antenna coil 54, and outer antenna coil $54_o$ of the RF antenna 54. By way of example, if the inner antenna coil $54_i$ and outer antenna coil $54_o$ have diameters of about 100 mm and about 300 mm, respectively, the floating coils $60_i$ and $60_o$ have diameters of about 80 mm and about 320 mm, respectively.

In this example, if the floating coils $60_i$ and $60_o$ are operated actively to generate inductively coupled plasma, electrostatic capacitances $C_{150i}$ and $C_{150o}$ of the fixed capacitors $150_i$ and $150_o$ are set such that the inner and outer induced currents $I_{INDi}$ and $I_{INDo}$ having certain magnitudes (for example, several times the magnitudes of the $I_{RFi}$ and $I_{RFo}$) flow through the floating coils $60_i$ and $60_o$, respectively, in the same direction in the circumferential direction as the inner antenna current $I_{RFi}$ and the outer antenna current $I_{RFo}$ respectively flowing in the inner antenna coil $54_i$ and the outer antenna coil $54_o$. That is, the electrostatic capacitances $C_{150i}$ and $C_{150o}$ of the fixed capacitors $150_i$ and $150_o$ are smaller than electrostatic capacitances obtained when a series resonance occurs within the floating coils $60_i$ and $60_o$, respectively, and, thus, the electrostatic capacitances $C_{150i}$ and $C_{150o}$ are set to be close thereto. Accordingly, even if the floating coils $60_i$ and $60_o$ are circular ring-shaped single-wound coils, the floating coils $60_i$ and $60_o$ have substantially the same function of assisting the inductively coupled plasma generation as circular ring-shaped multi-wound coils or spiral coils.

The circular ring-shaped single-wound floating coils $60_i$ and $60_o$ including the fixed capacitors $150_i$ and $150_o$ (particularly, the capacitors) are easy to manufacture and also advantageous to assembly of the RF antenna 54 and its surroundings and maintenance. Since there is no connection point nor connection conductor within the loops of the floating coils $60_i$ and $60_o$, the floating coils $60_i$ and $60_o$ have advantages of a low power loss and high electromagnetic uniformity in the circumferential direction.

In the plasma processing apparatus (FIG. 1) of the first illustrative embodiment, instead of the variable capacitor 58 provided in the floating coil 60, a fixed capacitor 150 may be used.

Figure 36:
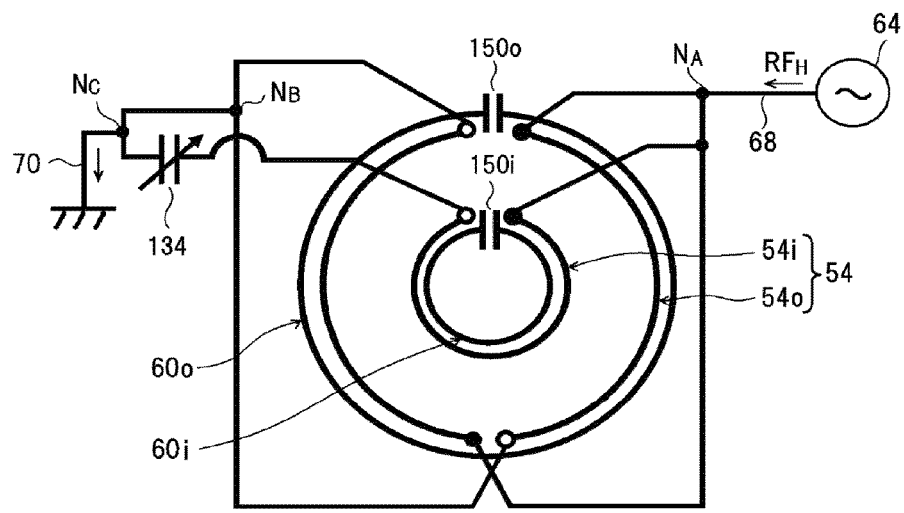
FIG. 36 illustrates another example where the fixed capacitor is provided in the loop of the floating coil.

FIGS. 36 to 43 illustrate modification examples of this example. As depicted in FIG. 36, the variable capacitor 134, as an impedance control unit, connected in series to the inner antenna coil $54_i$ may be provided between the node $N_A$ on the high frequency input side and the node $N_C$ on the high frequency output side. In this regard, in a configuration example of FIG. 35, the variable capacitor 96, as an impedance control unit, connected in series to the outer antenna coil $54_o$ may be provided between the node $N_A$ and the node $N_C$.

Figure 37:
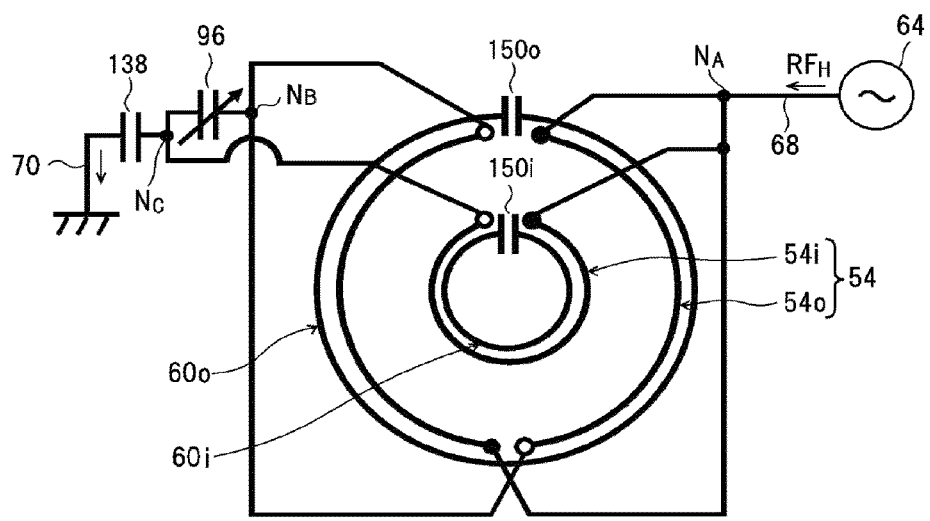
FIG. 37 illustrates still another example where the fixed capacitor is provided in the loop of the floating coil.

As depicted in FIG. 37, the output side common impedance control unit (for example, capacitor) 138 may be provided between the node $N_C$ and the earth line 70 (or on the earth line 70).

Figure 38:
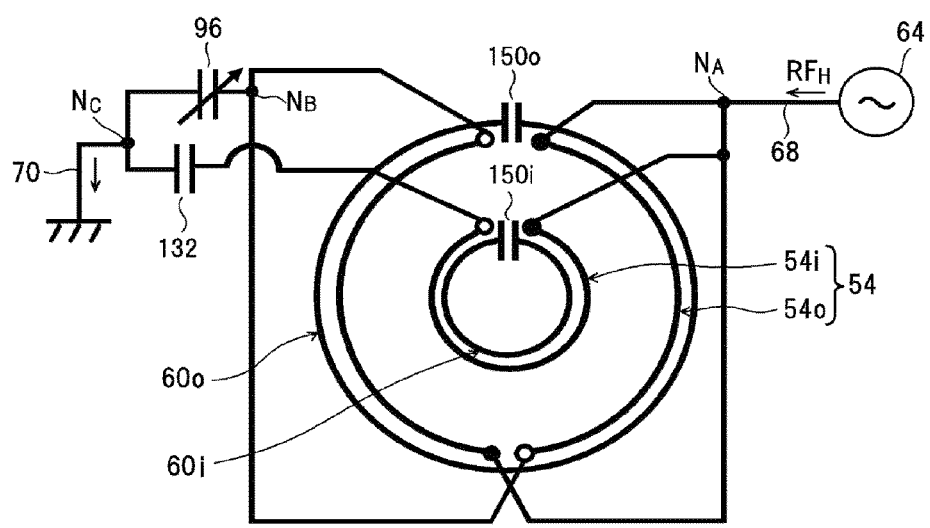
FIG. 38 illustrates still another example where the fixed capacitor is provided in the loop of the floating coil.

As depicted in FIG. 38, in order to increase a variable range of a balance between the inner antenna current $I_{RFi}$ and the outer antenna current $I_{RFo}$ flowing in the inner antenna coil $54_i$ and the outer antenna coil $54_o$, respectively, the variable capacitor 96 connected in series to the outer antenna coil $54_o$ and the fixed capacitor 132 connected in series to the inner antenna coil $54_i$ may be provided between the node $N_A$ and the node $N_C$.

Figure 39:
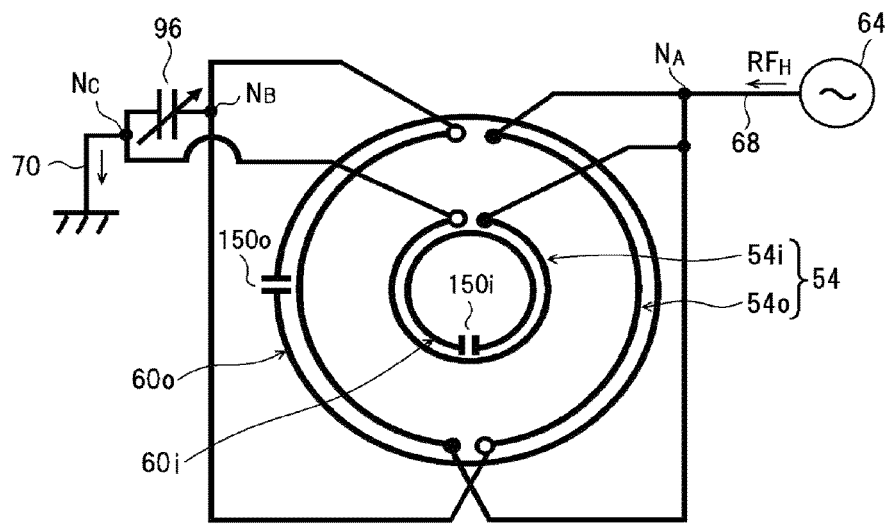
FIG. 39 illustrates still another example where the fixed capacitor is provided in the loop of the floating coil.
Figure 40:
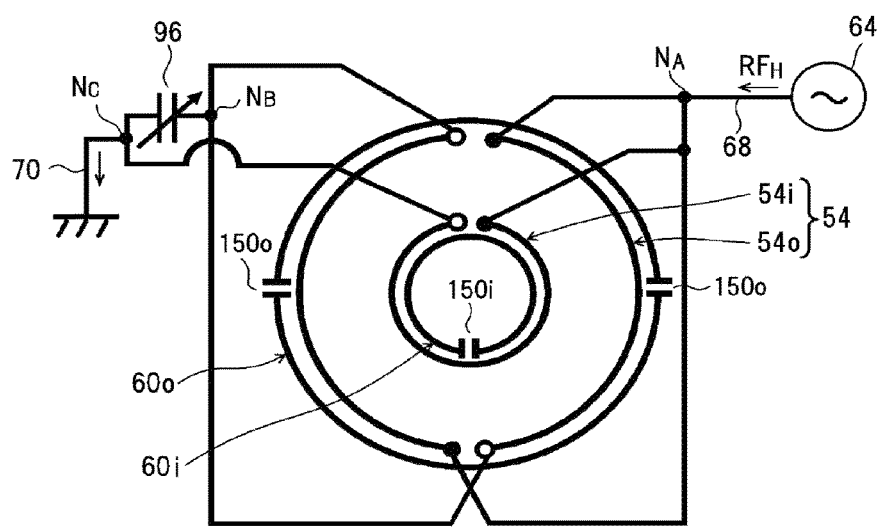
FIG. 40 illustrates still another example where the fixed capacitor is provided in the loop of the floating coil.

As depicted in FIG. 39, in order to suppress non-uniformity of a plasma density distribution in an azimuth direction, the fixed capacitors $150_i$ and $150_o$ (i.e. the gaps) in the loops of the floating coils $60_i$ and $60_o$ may be positioned so as to be deviated to each other in the circumferential direction. In such a case, as depicted in FIG. 40, a multiple number of (for example, two) fixed capacitors $150_o$ are provided in the loop of the outer floating coil $60_o$ at an equal distance from each other or in a point symmetry. Thus, it is possible to suppress the non-uniformity with more efficiency.

Figure 41:
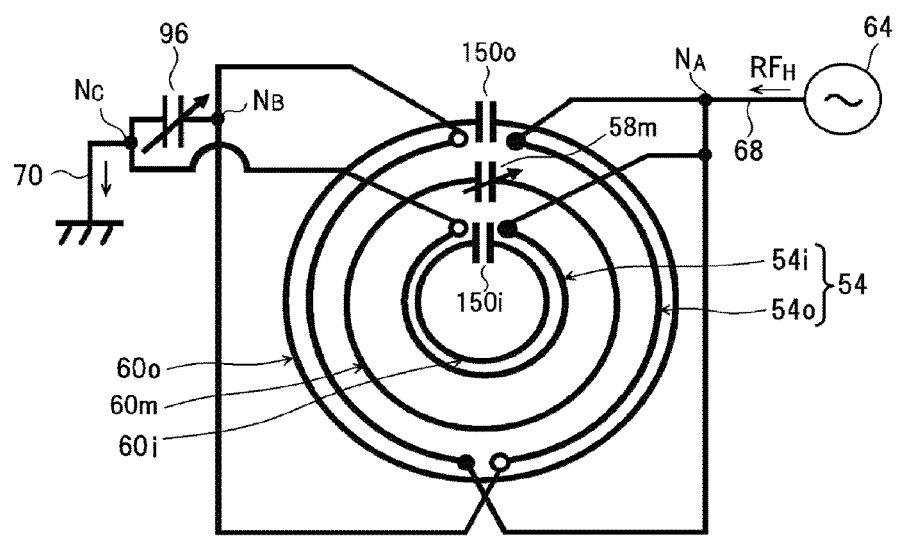
FIG. 41 illustrates still another example where the fixed capacitor is provided in the loop of the floating coil.

As depicted in FIG. 41, in order to increase controllability of a plasma density at an intermediate area in the radial direction, the intermediate floating coil $60_m$ including a variable capacitor $58_m$ may be provided (desirably, in the middle) between the inner antenna coil $54_i$ and the outer antenna coil $54_o$.

Figure 42:
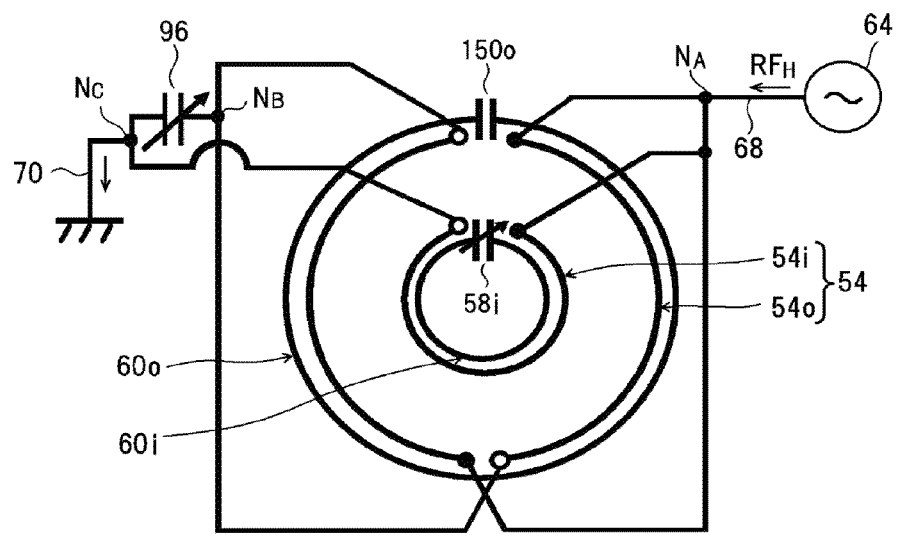
FIG. 42 illustrates still another example where the fixed capacitor is provided in the loop of the floating coil.

Otherwise, instead of the intermediate floating coil $60_m$, as depicted in FIG. 42, the variable capacitor 58 may be provided in the loop of the inner floating coil $60_i$, and the fixed capacitor $150_o$ may be provided in the loop of the outer floating coil $60_o$.

The fixed capacitor 150 provided in the loop of the floating coil 60 may be a commercially available capacitor. The gap $G_{60}$ of the floating coil 60 may be used as a gap between electrodes of the fixed capacitor 150. In such a case, a dielectric film may be inserted into the gap $G_{60}$.

[Example of RF Antenna not Having Impedance Control Unit]

Figure 43:
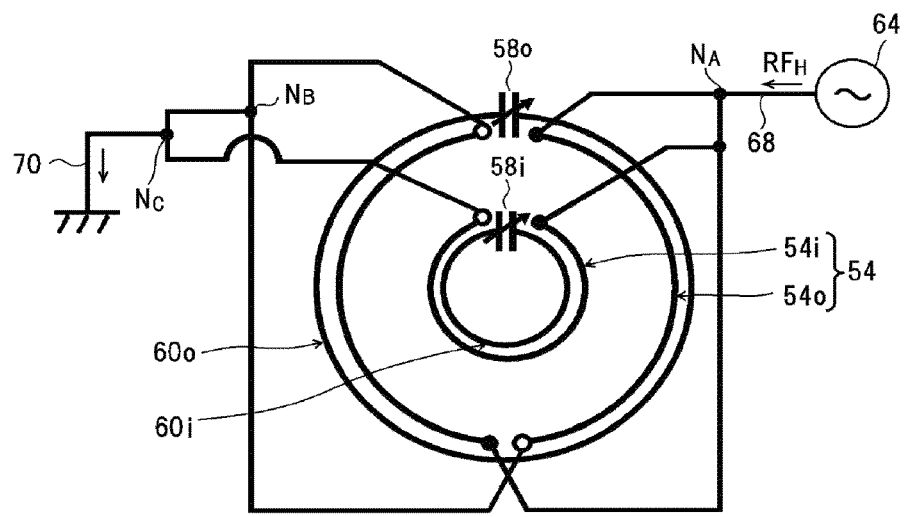
FIG. 43 illustrates an example where an impedance control unit is not provided in a RF antenna.

FIG. 43 illustrates a configuration in which the floating coils $60_i$ and $60_o$ including the variable capacitors $58_i$ and $58_o$ are respectively provided to be close as much as possible to the inner antenna coil $54_i$ and outer antenna coil $54_o$ of the RF antenna 54. In this configuration, instead of the fixed capacitors $150_i$ and $150_o$ described in the configuration example of FIG. 35, the variable capacitors $58_i$ and $58_o$ may be used. In such a configuration example, by controlling the electrostatic capacitances $C_{58i}$ and $C_{58o}$ of the variable capacitors $58_i$ and $58_o$, it is possible to control a balance between the inner induced currents $I_{INDi}$ and the outer induced current $I_{INDo}$ in the floating coils $60_i$ and $60_o$, respectively. Accordingly, impedance control units (variable capacitors 96 and 134) for controlling the balance between the inner antenna current $I_{RFi}$ flowing in the inner antenna coil $54_i$ and the outer antenna current $I_{RFo}$ flowing in the outer antenna coil $54_o$ are not needed.

Figure 44:
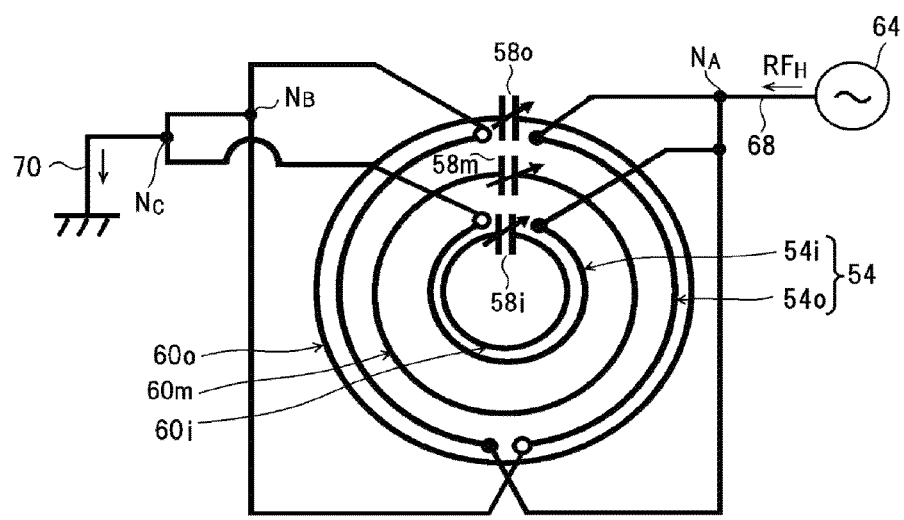
FIG. 44 illustrates another example where the impedance control unit is not provided in the RF antenna.

In this example, as depicted in FIG. 44, the intermediate floating coil $60_m$ including the variable capacitor $58_m$ may be provided (desirably, in the middle) between the inner antenna coil $54_i$ and the outer antenna coil $54_o$.

Figure 45:
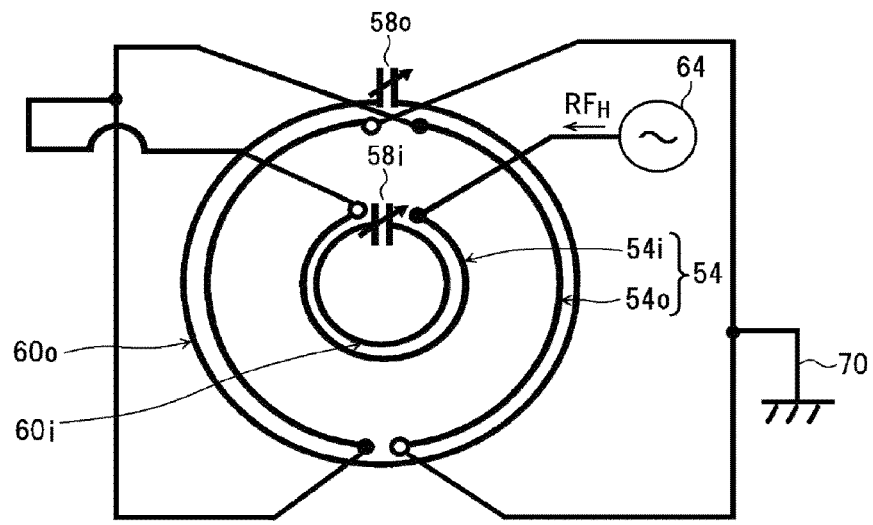
FIG. 45 illustrates still another example where the impedance control unit is not provided in the RF antenna.

In the above-described illustrative embodiments, a multiple number of (for example, inner and outer) antenna coils $54_i$ and $54_o$ are electrically connected in parallel to each other in the RF antenna 54. However, as depicted in FIG. 45, the multiple number of (inner and outer) antenna coils $54_i$ and $54_o$ may be electrically connected in series to each other. In such a case, the inner and outer floating coils $60_i$ and $60_o$ including the variable capacitors $58_i$ and $58_o$ control the plasma density distribution in the radial direction. That is, by respectively adjusting the electrostatic capacitances $C_{58i}$ and $C_{58o}$ of the variable capacitors $58_i$ and $58_o$, it is possible to control the plasma density distribution in the radial direction as desired. Further, in this configuration example, although a total length of the RF antenna 54 becomes increased, the number of coil segments (the number of division) of the inner antenna coil $54_i$ and the outer antenna coil $54_o$ is changed, so that the wavelength effect can be suppressed.

Figure 46:
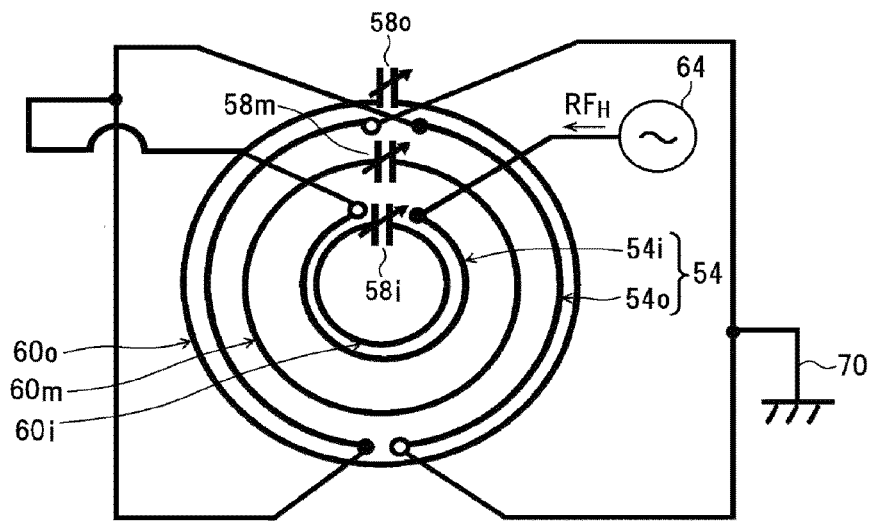
FIG. 46 illustrates still another example where the impedance control unit is not provided in the RF antenna.

In this example, as depicted in FIG. 46, the intermediate floating coil $60_m$ including the variable capacitor $58_m$ is be provided (desirably, in the middle) between the inner antenna coil $54_i$ and the outer antenna coil $54_o$. Thus, it is possible to accurately control a plasma density at an intermediate area in the radial direction as desired.

Another Illustrative Embodiment or Modification Example

A loop shape of a coil of a RF antenna in accordance with the present illustrative embodiments is not limited to a circular shape. Although not illustrated, it may be a square shape or a triangular shape. Further, a multiple number of coil segments of each antenna coil (loop) may have a different shape and different self-impedance to one another.

In the present illustrative embodiments, an impedance control unit of the RF antenna is not limited to a fixed capacitor or a variable capacitor as described above. By way of example, it may be a coil or an inductor or a unit including a capacitor and an inductor and may also include a resistance component.

Figure 47:
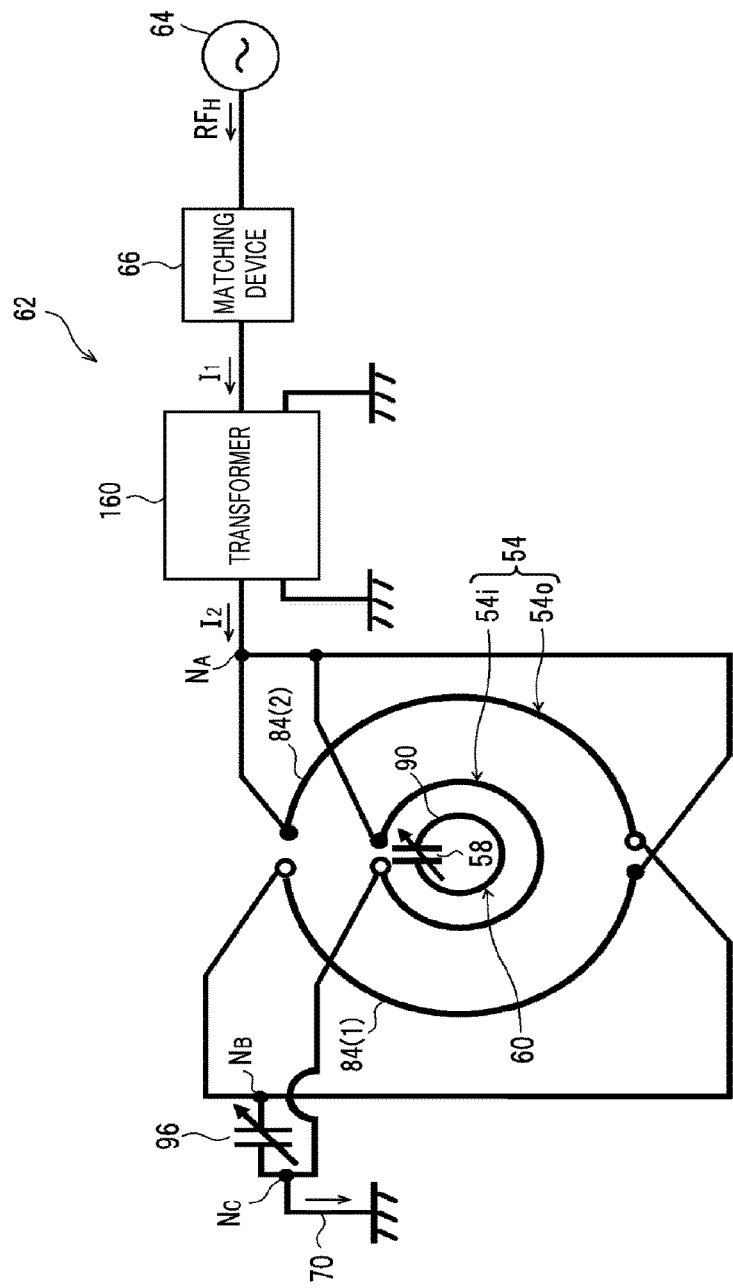
FIG. 47 illustrates a configuration in which a transformer is provided between a RF antenna and a matching device of a high frequency power supply unit.

FIG. 47 illustrates a configuration example in which a transformer 160 is provided between the matching device 66 of the high frequency power supply unit 62 and the RF antenna 54. A first wound wire of the transformer 160 is electrically connected to the output terminal of the matching device 66 and a second wound wire thereof is electrically connected to a first node $N_A$ on an input side of the RF antenna 54. Desirably, by setting the number of winding turns of the first wound wire to be higher than the number of winding turns of the second wound wire, it is possible to set a current (first current) $I_1$ flowing from the matching device 66 to the transformer 160 to be lower than a current (second current) $I_2$ flowing from the transformer 160 to the RF antenna 54. From another view, without increasing the first current $I_1$, it is possible to increase the second current $I_2$. Further, by changing a tap on a secondary side of the transformer 160, it may also be possible to vary the second current $I_2$.

In the above-described illustrative embodiments, the inner coil segment may extend at least one round in the circumferential direction. A length of the inner coil segment may be shorter than about ¼ of a wavelength of the high frequency power. Further, the multiple number of outer coil segments may be arranged to extend along one round in the circumferential direction or along the most of the one round in the circumferential direction as a whole. Furthermore, between the multiple number of outer coil segments, a high frequency input terminal of one outer coil segment of the multiple number of outer coil segments may be adjacent to a high frequency output terminal of another outer coil segment thereof with an outer gap therebetween, and a high frequency output terminal of said one outer coil segment may be adjacent to a high frequency input terminal of said another outer coil segment with an outer gap therebetween.

In the above-described illustrative embodiments, the multiple number of outer coil segments may extend at least one round in the circumferential direction as a whole. Further, a length of each of the multiple number of outer coil segments may be shorter than about ¼ of a wavelength of the high frequency power. The multiple number of outer coil segments may have substantially the same self-inductance. Furthermore, directions of electric currents flowing in the multiple number of outer coil segments may be same in the circumferential direction.

In the above-described illustrative embodiments, magnitudes of electric currents flowing in the multiple number of outer coil segments may be substantially same. Further, a direction of an electric current flowing in the inner antenna coil and a direction of an electric current flowing in the outer antenna coil may be same in the circumferential direction. The inner antenna coil and the outer antenna coil may be electrically connected in parallel to each other between a first node at the side of the high frequency power supply unit and a second node at a ground potential side.

In the above-described illustrative embodiments, between the first node and the second node, the inner coil segment may be electrically connected to an inner impedance control unit in series, and the multiple number of outer coil segments are not electrically connected to an impedance control unit. Further, between the first node and the second node, the multiple number of outer coil segments may be electrically connected to a multiple number of outer impedance control units in series, respectively, and the inner coil segment may not be electrically connected to an impedance control unit. Furthermore, between the first node and the second node, the inner coil segment may be electrically connected to an inner impedance control unit in series and the multiple number of outer coil segments may be electrically connected to a multiple number of outer impedance control units in series, respectively.

In the above-described illustrative embodiments, the at least one floating coil may be positioned between the inner antenna coil and the outer antenna coil in a radial direction. Alternatively, the at least one floating coil may be positioned in the middle between the inner antenna coil and the outer antenna coil. Further alternatively, the at least one floating coil may be provided inside the inner antenna coil or outside the outer antenna coil in a radial direction. The inner antenna coil, the outer antenna coil, and the at least one floating coil may be arranged to be coaxial to one another. The at least one floating coil and the RF antenna may be arranged on the same plane.

In the above-described illustrative embodiments, the at least one floating coil may be positioned farther than the RF antenna from the dielectric window. Further, an electric current flowing in the at least one floating coil may have the same direction as electric currents flowing in the inner antenna coil and the outer antenna coil in the circumferential direction. Furthermore, an electrostatic capacitance of the capacitor in the at least one floating coil may be smaller than an electrostatic capacitance obtained when a series resonance occurs in the at least one floating coil. Moreover, the at least one floating coil may include a reactance having a negative value.

In the above-described illustrative embodiments, a direction of an electric current flowing in the at least one floating coil may be opposite to directions of electric currents flowing in the inner antenna coil and the outer antenna coil in the circumferential direction. Further, an electrostatic capacitance of the capacitor in the at least one floating coil may be greater than an electrostatic capacitance obtained when a series resonance occurs in the at least one floating coil. The at least one floating coil may include a reactance having a positive value.

In the above-described illustrative embodiments, the capacitor in the at least one floating coil may be a variable capacitor, and a variable range of an electrostatic capacitance of the variable capacitor may have a value smaller than a value obtained when a series resonance occurs in the at least one floating coil. Further, the capacitor in the at least one floating coil may be a variable capacitor, and a variable range of an electrostatic capacitance of the variable capacitor may have a value greater than a value obtained when a series resonance occurs in the at least one floating coil. In addition, the at least one floating coil may be plural in number, and the floating coils may be arranged to be coaxial to one another.

In the above-described illustrative embodiment, the illustrated configuration of the inductively coupled plasma etching apparatus is nothing more than an example. Not only each component of the plasma generating mechanism but also each component which is not directly relevant to plasma generation can be modified in various manners.

By way of example, the basic shape of the RF antenna may be a dome shape besides the planar shape mentioned above. Further, it may be also possible to have configuration in which a processing gas is introduced into the chamber 10 from the processing gas supply unit through a ceiling. Furthermore, it may be also possible not to apply a high frequency power $RF_L$ for DC bias control to the susceptor 12.

The inductively coupled plasma processing apparatus or the inductively coupled plasma processing method of the present disclosure can be applied to, not limited to a plasma etching technology, other plasma processes such as plasma CVD, plasma oxidation, plasma nitridation, and sputtering. Further, the target substrate in the present disclosure may include, but is not limited to a semiconductor wafer, various kinds of substrates for a flat panel display or photo mask, a CD substrate, and a print substrate.

What is claimed is:

1. A plasma processing apparatus comprising:
   a processing chamber having a dielectric window;
   a substrate holding unit configured to hold thereon a processing target substrate within the processing chamber;
   a processing gas supply unit configured to supply a processing gas into the processing chamber to perform a plasma process on the substrate;
   a RF antenna, provided outside the dielectric window to generate plasma of the processing gas within the processing chamber by inductive coupling, having a plurality of coil segments that are arranged along a loop having a predetermined shape and a predetermined size while electrically connected to each other in parallel;
   a high frequency power supply unit configured to supply a high frequency power having a frequency for generating a high frequency electric discharge of the processing gas;
   at least one floating coil that is in an electrically floating state and provided outside the processing chamber to be coupled to the RF antenna by an electromagnetic induction; and
   a capacitor provided in a loop of the at least one floating coil,
   wherein an angular frequency on a radius of the at least one floating coil is denoted by $\omega$, a mutual inductance between the RF antenna and the at least one floating coil is denoted by M, an antenna current flowing in the RF antenna is denoted by $I_{RF}$, a self-inductance of the at least one floating coil is denoted by L, and an electrostatic capacitance of the capacitor is denoted by C, and an induced current $I_{IND}$ flowing in the at least one floating coil is expressed by an approximation equation:

$I_{IND} \approx -M\omega I_{RF}/(L\omega 1/C\omega)$, and the at least one floating coil and the RF antenna are arranged on the same plane.

2. The plasma processing apparatus of claim 1, wherein the plurality of coil segments are extended along at least one round of the loop or along the most of the at least one round of the loop of the RF antenna as a whole.

3. The plasma processing apparatus of claim 1,
   wherein a high frequency input terminal of one coil segment of the plurality of coil segments is adjacent to a high frequency output terminal of another coil segment thereof with a gap therebetween, and
   a high frequency output terminal of said one coil segment is adjacent to a high frequency input terminal of said another coil segment with a gap therebetween.

4. The plasma processing apparatus of claim 3, wherein all the gaps are formed in a circumferential direction of the loop of the RF antenna.

5. The plasma processing apparatus of claim 3, wherein at least one of the gaps is formed in a direction perpendicular to a circumferential direction of the loop of the RF antenna.

6. The plasma processing apparatus of claim 1, wherein the plurality of coil segments are extended along at least one round of the loop of the RF antenna as a whole.

7. The plasma processing apparatus of claim 1, wherein a length of each of the plurality of coil segments is shorter than about ¼ of a wavelength of the high frequency power.

8. The plasma processing apparatus of claim 1, wherein the plurality of coil segments have substantially the same self-inductance.

9. The plasma processing apparatus of claim 1, wherein directions of electric currents flowing in the plurality of coil segments are same along the loop of the RF antenna.

10. The plasma processing apparatus of claim 9, wherein a direction of an electric current flowing in the at least one floating coil is the same as a direction of an electric current flowing in the RF antenna in the circumferential direction.

11. The plasma processing apparatus of claim 10, wherein an electrostatic capacitance of the capacitor in the at least one floating coil is smaller than an electrostatic capacitance obtained when a series resonance occurs in the at least one floating coil.

12. The plasma processing apparatus of claim 10, wherein the at least one floating coil includes a reactance having a negative value.

13. The plasma processing apparatus of claim 9, wherein a direction of an electric current flowing in the at least one floating coil is opposite to a direction of an electric current flowing in the RF antenna in a circumferential direction.

14. The plasma processing apparatus of claim 13, wherein an electrostatic capacitance of the capacitor in the at least one floating coil is greater than an electrostatic capacitance obtained when a series resonance occurs in the at least one floating coil.

15. The plasma processing apparatus of claim 13, wherein the at least one floating coil includes a reactance having a positive value.

16. The plasma processing apparatus of claim 1, wherein magnitudes of electric currents flowing in the plurality of coil segments are substantially same.

17. The plasma processing apparatus of claim 1, wherein the loop of the RF antenna is parallel to the dielectric window.

18. The plasma processing apparatus of claim 1, wherein the loop of the RF antenna is coaxial to the substrate held on the substrate holding unit.

19. The plasma processing apparatus of claim 1, wherein the at least one floating coil is arranged to be coaxial to the RF antenna.

20. The plasma processing apparatus of claim 1, wherein the at least one floating coil is electromagnetically coupled to each of the plurality of coil segments with the same mutual inductance.

21. The plasma processing apparatus of claim 1, wherein the at least one floating coil is provided inside or outside the RF antenna in a radial direction.

22. The plasma processing apparatus of claim 1, wherein a loop of the at least one floating coil has a similar shape to the loop of the RF antenna.

23. The plasma processing apparatus of claim 22, wherein the loop of the at least one floating coil has a diameter of about ⅓ to about 3 times a diameter of the loop of the RF antenna.

24. The plasma processing apparatus of claim 1, wherein the capacitor in the at least one floating coil is a variable capacitor, and a variable range of an electrostatic capacitance of the variable capacitor has a value smaller than a value obtained when a series resonance occurs in the at least one floating coil.

25. The plasma processing apparatus of claim 1, wherein the capacitor in the at least one floating coil is a variable capacitor, and a variable range of an electrostatic capacitance of the variable capacitor has values smaller and greater than a value obtained when a series resonance occurs in the at least one floating coil.

26. The plasma processing apparatus of claim 1, wherein the capacitor in the at least one floating coil is a variable capacitor, and a variable range of an electrostatic capacitance of the variable capacitor has a value greater than a value obtained when a series resonance occurs in the at least one floating coil.

27. The plasma processing apparatus of claim 1, wherein the at least one floating coil is plural in number, and the floating coils are arranged to be coaxial to one another.

* * * * *